United States Patent
Cho et al.

(10) Patent No.: US 10,846,171 B2
(45) Date of Patent: Nov. 24, 2020

(54) ERROR CORRECTION CODE DECODERS, SEMICONDUCTOR MEMORY DEVICES AND MEMORY SYSTEMS

(71) Applicant: SAMSUNG ELECTRONICS CO., LTD., Suwon-si (KR)

(72) Inventors: Sung-Hye Cho, Hwaseong-si (KR); Ki-Jun Lee, Seoul (KR); Myung-Kyu Lee, Seoul (KR); Jun Jin Kong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/371,534

(22) Filed: Apr. 1, 2019

(65) Prior Publication Data
US 2020/0142771 A1 May 7, 2020

(30) Foreign Application Priority Data
Nov. 6, 2018 (KR) .......... 10-2018-0134853

(51) Int. Cl.
  *G11C 29/00* (2006.01)
  *G06F 11/10* (2006.01)
  *G11C 29/52* (2006.01)

(52) U.S. Cl.
  CPC .......... *G06F 11/1068* (2013.01); *G11C 29/52* (2013.01)

(58) Field of Classification Search
  CPC ................. G06F 11/1068; G11C 29/52
  See application file for complete search history.

(56) References Cited

U.S. PATENT DOCUMENTS 6,822,913 B2   11/2004  Pochmuller
8,028,221 B2   9/2011   Franke
(Continued)

FOREIGN PATENT DOCUMENTS

JP      2006-60465 A     3/2006

OTHER PUBLICATIONS

Sanguhn Cha et al., "Defect Analysis and Cost-effective Resilience Architecture for Future DRAM Devices", 2017 IEEE International Symposium on High Performance Computer Architecture, May 8, 2017, pp. 61-72 (12 total pages).

*Primary Examiner* — Samir W Rizk
(74) *Attorney, Agent, or Firm* — Sughrue Mion, PLLC

(57) ABSTRACT

An error correction code (ECC) decoder of a semiconductor memory device is provided. The ECC decoder includes an ECC checker, a syndrome generator, and an error detection/correction circuit. The ECC checker generates characteristic information representing first error information associated with message bits in an input codeword that is read from a target page in a memory cell array. The syndrome generator outputs a syndrome vector representing second error information associated with the input codeword by performing an operation on the message bits and parity bits in the input codeword based on a parity check matrix. The an error detection/correction circuit generates a transmission codeword by selectively correcting an error bit in the input codeword based on the characteristic information and the syndrome vector, generates a flag signal indicating whether the transmission codeword includes an error bit, and outputs a transmission message based on the transmission codeword.

20 Claims, 25 Drawing Sheets

(56) References Cited

U.S. PATENT DOCUMENTS

| | | |
|---|---|---|
| 8,069,389 B2 | 11/2011 | Yim et al. |
| 8,381,083 B2 | 2/2013 | Wezelenburg et al. |
| 9,647,693 B2 | 5/2017 | Tsuboi et al. |
| 2016/0048425 A1* | 2/2016 | Kim .................. G11C 29/52 714/764 |
| 2018/0189132 A1 | 7/2018 | Malladi et al. |

* cited by examiner

FIG. 4

| DATA BITS | PARITY BITS | | | PARITY O/H | | |
|---|---|---|---|---|---|---|
| | SEC | SEC-DED | DEC | SEC | SEC-DED | DEC |
| 8 | 4 | 5 | 8 | 50.0% | 62.5% | 100% |
| 64 | 7 | 8 | 14 | 10.9% | 12.5% | 21.9% |
| 128 | 8 | 9 | 16 | 6.3% | 7.0% | 12.5% |
| 256 | 9 | 10 | 18 | 3.5% | 3.9% | 7.0% |
| 512 | 10 | 11 | 20 | 2.0% | 2.1% | 3.9% |

FIG. 12B

| | |
|---|---|
| CI=0   SV=0 | No Error |
| CI=0 , x:odd | one-bit error |
| CI=0 , x:even , x>0 | two-bit error |
| CI=1   x:odd | two-bit error |
| CI=1   x:even   x>0 | one-bit error |

$x = \Sigma S_i$
$CI = (\Sigma d_i) \bmod 2$

FIG. 14

| # of Total error | # of Error in INP11 | # of Error in INP12 | CI=(Σ di)mod2 | x=Σ si | t=CI+x |
|---|---|---|---|---|---|
| 0 | 0 | 0 | 0 | 0 | odd(t>0) |
| 1 | 1 | 0 | 1 | Evnor OR 0 | odd(t>0) |
| 1 | 0 | 1 | 0 | odd | Even(t>0) |
| 2 | 1 | 1 | 1 | odd | Even(t>0) |
| 2 | 2 | 0 | 0 | Even & X>0 | Even(t70) |
| 2 | 0 | 2 | 0 | Even & X>0 | Even(t70) |

FIG. 17B

| | |
|---|---|
| CI=0  SV=0 | No Error |
| CI=0  s(k-1):1 | one-bit error |
| CI=0  s(k-1)=0  SV≠0 | two-bit error |
| CI=1  s(k-1)=1 | two-bit error |
| CI=1  s(k-1)=1  SV≠0 | one-bit error |

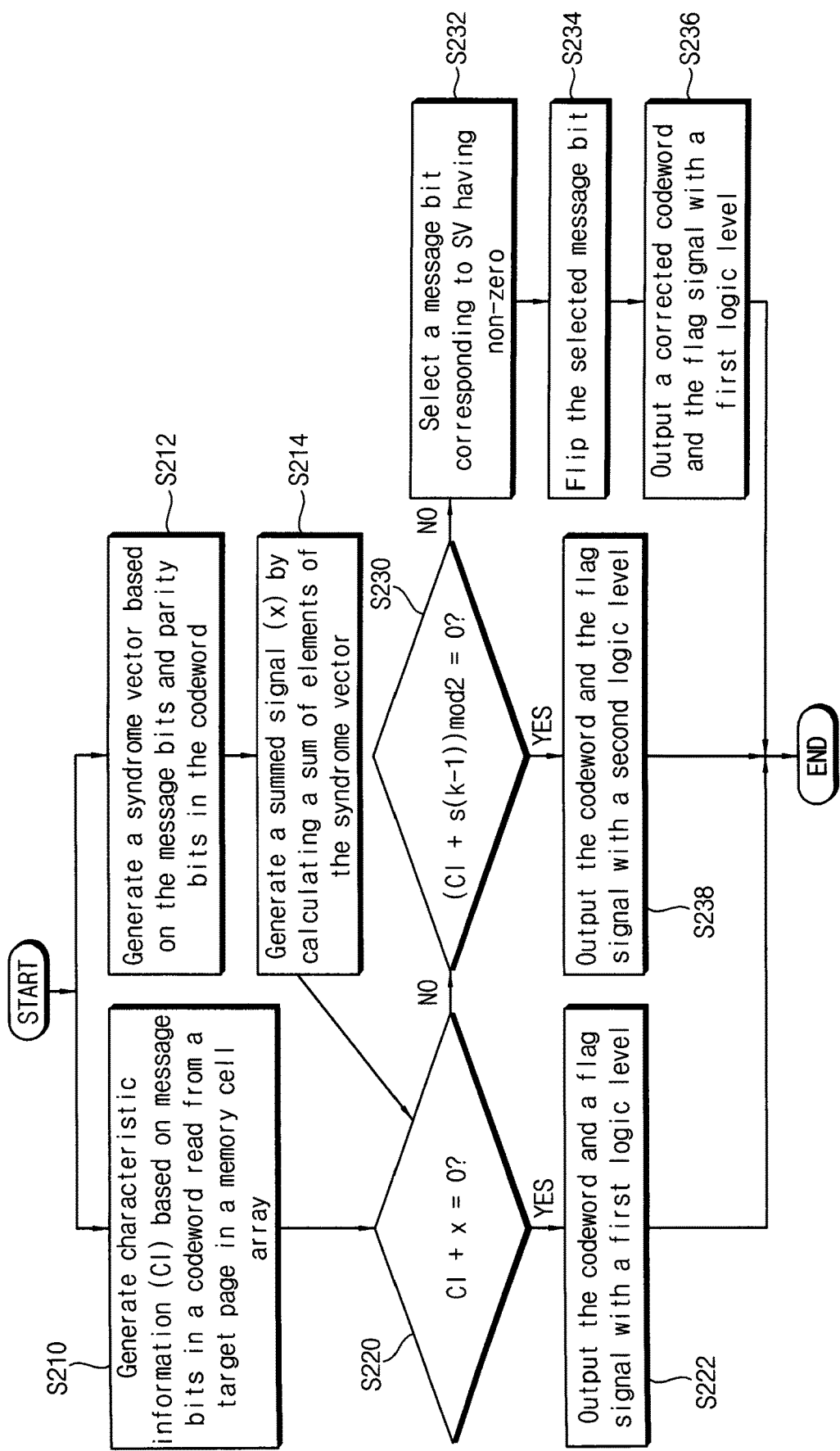

FIG. 19

| # of Total error | # of Error in INP21 | # of Error in PTP22 | $CI=(\Sigma di)mod2$ | $s(k-1), SV$ | $r=(CI+s(k-1))mod2$ |
|---|---|---|---|---|---|
| 0 | 0 | 0 | 0 | 0, SV=0 | 0, SV=0 |
| 1 | 1 | 0 | 1 | 0, SV≠0 | 1, SV≠0 |
| 1 | 0 | 1 | 1 | 1, SV≠0 | 1, SV≠0 |
| 2 | 1 | 1 | 0 | 1, SV≠0 | 0, SV≠0 |
| 2 | 2 | 0 | 0 | 0, SV=0 | 0, SV≠0 |
| 2 | 0 | 2 | 0 | 0, SV=0 | 0, SV≠0 |

ERROR CORRECTION CODE DECODERS, SEMICONDUCTOR MEMORY DEVICES AND MEMORY SYSTEMS

CROSS-REFERENCE TO RELATED APPLICATION(S)

This application claims priority under 35 U.S.C. § 119 from Korean Patent Application No. 10-2018-0134853, filed on Nov. 6, 2018 in the Korean Intellectual Property Office, the disclosure of which is incorporated by reference herein in its entirety.

BACKGROUND

1. Technical Field

Example embodiments relate to memory devices, and more particularly to error correction code (ECC) decoders of semiconductor memory devices, semiconductor memory devices and memory systems.

2. Discussion of the Related Art

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrinkage in fabrication design rule of DRAMs, bit errors of memory cells in the DRAMs may rapidly increase and yield of the DRAMs may decrease.

SUMMARY

It is an aspect to provide an error correction code (ECC) decoder of a semiconductor memory device, capable of enhancing error detection capability without increasing parity overhead.

It is another aspect to provide a semiconductor memory device capable of enhancing error detection capability without increasing parity overhead.

It is another aspect to provide a memory system capable of enhancing error detection capability without increasing parity overhead.

According to an aspect of one or more example embodiments, there is provided an error correction code (ECC) decoder of a semiconductor memory device, the ECC decoder comprising an ECC checker configured to generate characteristic information representing first error information associated with message bits in an input codeword that is read from a target page in a memory cell array; a syndrome generator configured to output a syndrome vector representing second error information associated with the input codeword by performing an operation on the message bits and parity bits in the input codeword based on a parity check matrix; and an error detection/correction circuit configured to generate a transmission codeword by selectively correcting an error bit in the input codeword based on the characteristic information and the syndrome vector, generate a flag signal indicating whether the transmission codeword includes an error bit, and output a transmission message based on the transmission codeword.

According to another aspect of one or more example embodiments, there is provided a semiconductor memory device comprising a memory cell array including a plurality of memory cells coupled to a plurality of word-lines and a plurality of bit-lines; an error correction code (ECC) engine configured to perform an ECC encoding on a message received from outside of the semiconductor memory device to generate an initial codeword, store the initial codeword in a target page in the memory cell array, generate characteristic information and a syndrome vector based on the initial codeword read from the target page, generate a transmission codeword by selectively correcting an error bit in the initial codeword based on the characteristic information and the syndrome vector, and generate a flag signal indicating whether the transmission codeword includes an error bit; and a control logic circuit configured to control the ECC engine based on a command and an address received from outside the semiconductor memory device.

According to another aspect of one or more example embodiments, there is provided a memory system comprising a semiconductor memory device; and a memory controller configured to control the semiconductor memory device, wherein the semiconductor memory device includes a memory cell array including a plurality of memory cells coupled to a plurality of word-lines and a plurality of bit-lines; an error correction code (ECC) engine configured to perform an ECC encoding on a message received from the memory controller to generate an initial codeword, store the initial codeword in a target page in the memory cell array, generate characteristic information and a syndrome vector based on the initial codeword that is read from the target page, generate a transmission codeword by selectively correcting an error bit in the initial codeword that is read based on the characteristic information and the syndrome vector, and generate a flag signal indicating whether the transmission codeword includes an error bit; and a control logic circuit configured to control the ECC engine based on a command and an address received from the memory controller.

According to another aspect of one or more example embodiments, there is provided an error correction code (ECC) decoder comprising at least one microprocessor configured to generate characteristic information from message bits in an input codeword read from a target page in a memory cell array; generate a syndrome vector from the input codeword by performing an operation on the message bits and parity bits in the input codeword based on a parity check matrix; and generate a transmission codeword by selectively correcting a first error bit in the input codeword based on the characteristic information and the syndrome vector, wherein the ECC decoder detects whether the first error bit occurs in the input codeword and detects whether a second error bit occurs in the input codeword, based on characteristic information and the syndrome vector, and generates a flag signal indicating whether the second error bit occurs.

BRIEF DESCRIPTION OF THE DRAWINGS

Illustrative, non-limiting example embodiments will be more clearly understood from the following detailed description taken in conjunction with the accompanying drawings, in which:

FIG. 4 is a diagram for describing on-chip ECC levels according to data bits and parity bits;

FIG. 12B is a table illustrating a number of error bits, which is determined according to characteristic information, a syndrome vector and a summed signal in the error detection/correction circuit in FIG. 12A;

FIG. 14 is a table illustrating a number of error bits, which is determined according to characteristic information, a syndrome vector and a summed signal in the error detection/correction circuit in FIG. 12A;

FIG. 17B is a table illustrating a number of error bits, which is determined according to characteristic information, a syndrome vector and a summed signal in the error detection/correction circuit in FIG. 17A;

FIG. 18 is a flow chart illustrating another example operation of the ECC decoder of FIG. 9 according to example embodiments;

FIG. 19 is a table illustrating a number of error bits, which is determined according to characteristic information, a syndrome vector and a selected element in the error detection/correction circuit in FIG. 17A;

DETAILED DESCRIPTION

Various example embodiments will be described more fully hereinafter with reference to the accompanying drawings, in which some example embodiments are shown.

According to various example embodiments disclosed herein, message bits in a code include information associated with system level error correction code (ECC). An ECC decoder in a semiconductor memory device generates characteristic information based on the message bits, generates a syndrome vector based on the codeword, and detects/corrects an error bit in the codeword based on the characteristic information and the syndrome vector. Therefore, the ECC decoder and the semiconductor memory device are capable of enhancing error detection capability by detecting two error bits and correcting one error bit based on a single error correction (SEC) code.

Figure 1:
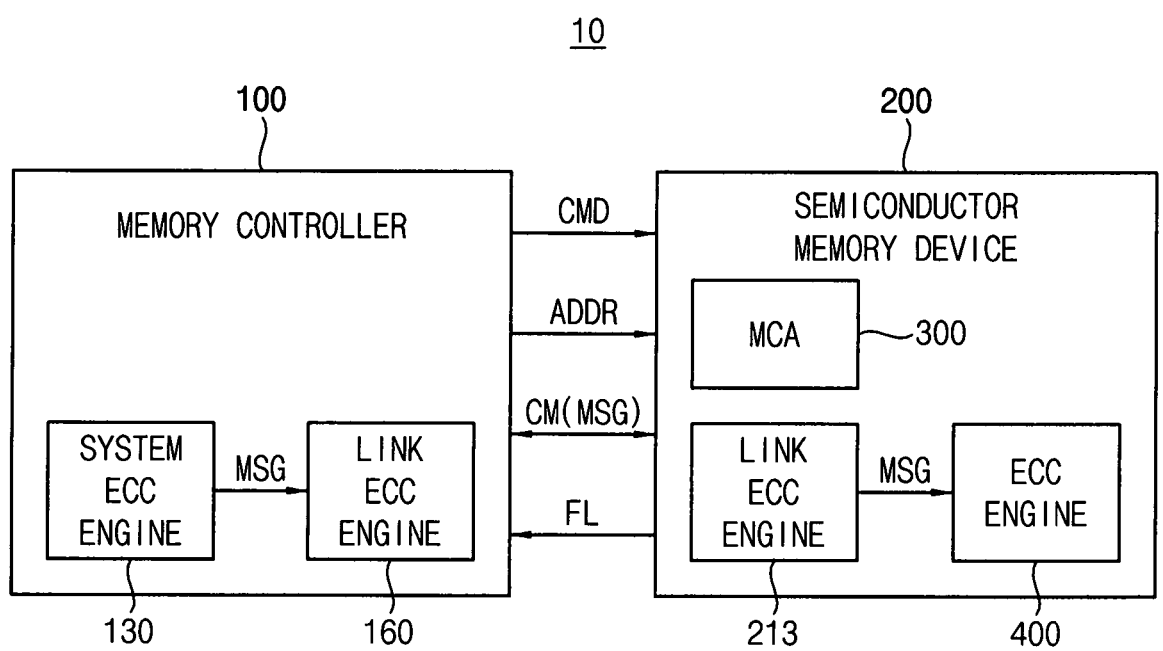
FIG. 1 is a block diagram illustrating a memory system according to example embodiments.

FIG. 1 is a block diagram illustrating a memory system according to example embodiments.

Referring to FIG. 1, a memory system 10 may include a memory controller 100 and a semiconductor memory device 200.

The memory controller 100 may control an overall operation of the memory system 10. The memory controller 100 may control an overall data exchange between a host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

The memory controller 100 transmits a command CMD and an address ADDR to the semiconductor memory device 200 and exchanges a message CM(MSG) with the semiconductor memory device 200. The semiconductor memory device 200 transmits a flag signal FL to the memory controller 100.

In some embodiments, the semiconductor memory device 200 is a memory device including resistive type memory cells such as a magnetoresistive random access memory (MRAM), a resistive random access memory (RRAM), a phase change random access memory (PRAM) and a ferroelectric random access memory (FRAM), etc. In other exemplary embodiments, the semiconductor memory device 200 includes dynamic memory cells such as a dynamic random access memory (DRAM).

The memory controller 100 may include a system ECC engine 130 and a link ECC engine 160, and the semiconductor memory device 200 may include a link ECC engine 213, an ECC engine 400 and a memory cell array (MCA) 300.

In some example embodiments, the memory controller 100 may omit the link ECC engine 160 and the semiconductor memory device 200 may omit the link ECC engine 213.

The system ECC engine 130 performs a first encoding on a data received from the host to generate a message MSG and provides the message MSG to the link ECC engine 160. The link ECC engine 160 performs a link ECC encoding on the message MSG to generate link parity and transmit, to the semiconductor memory device 200, a coded message CM. The coded message CM includes the link parity and the message MSG. In addition, the link ECC engine 160 may receive a coded message CM from the semiconductor memory device 200, perform a link ECC decoding on the coded message CM provided from the semiconductor memory device 200 to recover the message MSC, and provide the message MSG to the system ECC engine 130. The system ECC engine 130 performs a first ECC decoding on the message MSG to recover the data and provides the data to the host. The system ECC engine 130 may use a first ECC. In example embodiments, the first ECC may be a single parity check code, or a single error correction/double error detection (SEC-DED) code. In other example embodiments, the first ECC may be, for example, a code in which a sum of all bits in the coded message CM corresponds to an even number.

The link ECC engine 213 performs a link ECC decoding on the coded message CM provided from the memory controller 100 to recover the message MSC; and provides the message MSG to the ECC engine 400. The ECC engine 400 performs an ECC encoding on the message MSG based on a second ECC to generate parity bits and stores a codeword including the message MSG and the parity bits in a target page in the memory cell array 300. In addition, the ECC engine 400 generates characteristic information and a syndrome vector based on a codeword read from the target page, selectively corrects an error bit in the read codeword based on the characteristic information and the syndrome vector, and generates a flag signal indicating whether a transmission message to be transmitted to the memory controller 100 includes an error bit.

The link ECC engine 213 performs a link ECC encoding on the transmission message and provides the coded message CM to the memory controller 100.

Figure 2:
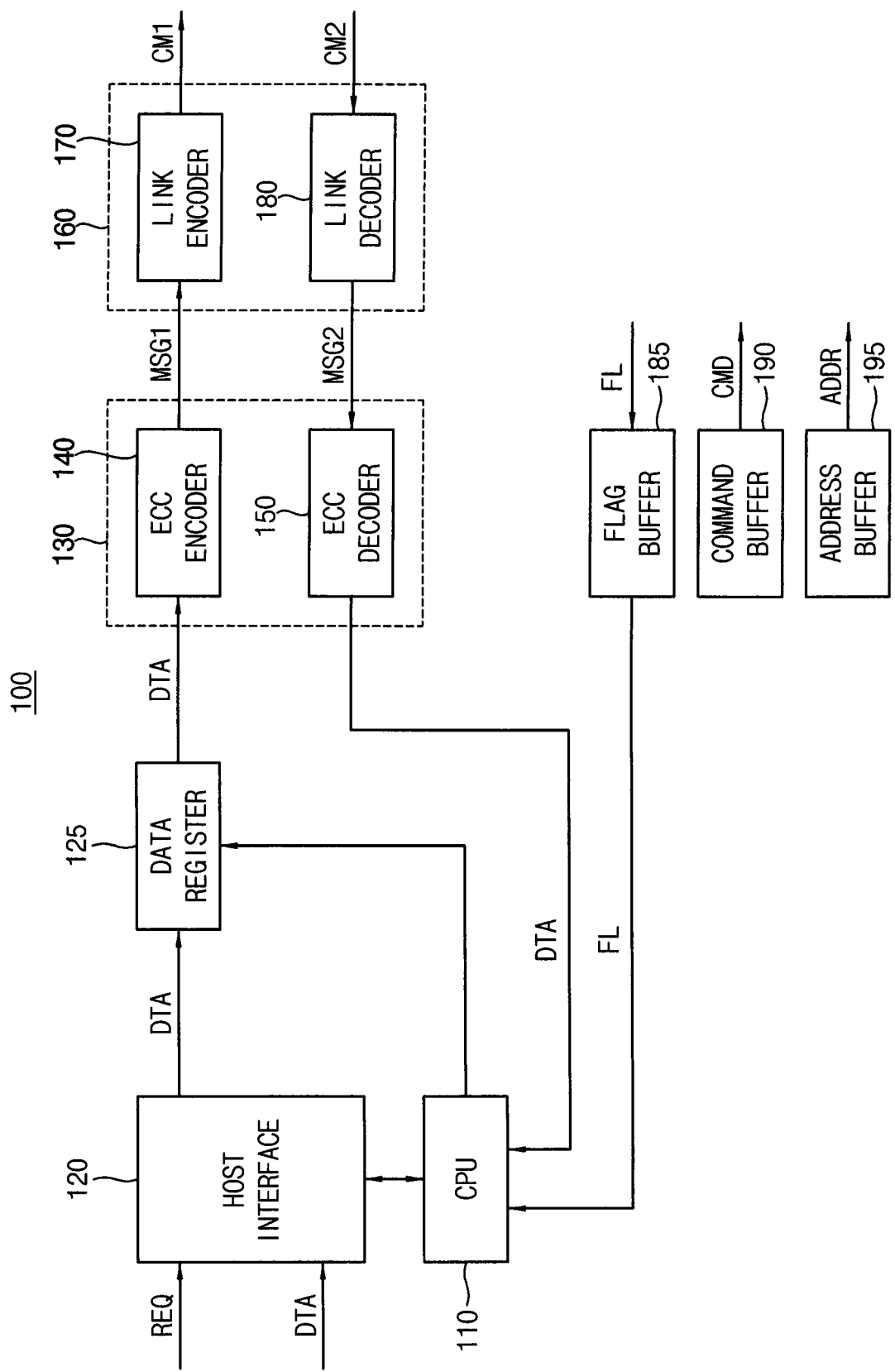
FIG. 2 is block diagram illustrating a memory controller in the memory system of FIG. 1 according to example embodiments.

FIG. 2 is block diagram illustrating the memory controller in the memory system of FIG. 1 according to example embodiments.

Referring to FIG. 2, the memory controller 100 includes a central processing unit (CPU) 110, a host interface 120, a data register 125, the system ECC engine 130, the link ECC engine 160, a flag buffer 185, a command buffer 190 and an address buffer 195. The system ECC engine 130 includes an ECC encoder 140 and an ECC decoder 150. The link ECC engine 160 includes a link ECC encoder 170 and a link ECC decoder 180.

The host interface 120 receives a request REQ and data DTA from the host and provides the data DTA to the data register 125. The data register 125 continuously (or sequentially) outputs the data to the system ECC engine 130.

The ECC encoder 140 performs a first ECC encoding on the data to generate a message MSG1 and provides the message MSG1 to the link ECC encoder 170. The link ECC encoder 170 performs a link ECC encoding on the message MSG1 to output a coded message CM1.

The link ECC decoder 180 performs a link ECC decoding on a coded message CM2 received from the semiconductor memory device 200 to generate a message MSG2 and provides the message MSG2 to the system ECC decoder 150. The system ECC decoder 150 performs a first ECC decoding on the message MSG2 to recover the data DTA and provides the data DTA to the CPU 110. The flag buffer 185 receives the flag signal FL from the semiconductor memory device 200 and provides the flag signal FL to the CPU 110.

The CPU 110 receives the data DTA and the flag signal FL and determines how to process the data DTA based on the flag signal FL.

The command buffer 190 stores the command CMD corresponding to the request REQ and transmits the command CMD to the semiconductor memory device 200 under control of the CPU 110. The address buffer 195 stores the address ADDR and transmits the address ADDR to the semiconductor memory device 200 under control of the CPU 110.

Figure 3:
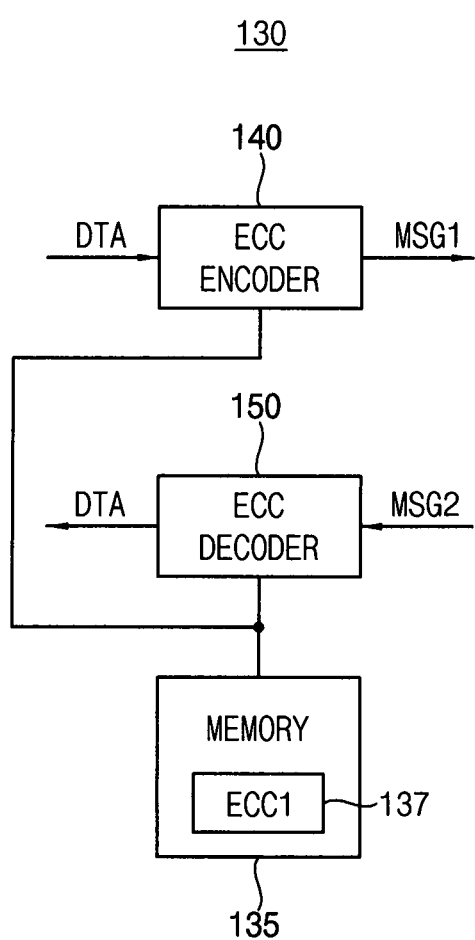
FIG. 3 is a block diagram illustrating an example of a system ECC engine in the memory controller of FIG. 2 according to example embodiments.

FIG. 3 is a block diagram illustrating an example of the system ECC engine in FIG. 2 according to example embodiments.

Referring to FIG. 3, the system ECC engine 130 includes a memory 135, the ECC encoder 140 and the ECC decoder 150.

The memory 135 may include a first ECC (ECC1) 137. The first ECC 137 may be a single parity check code, or a SEC-DED code. The first ECC 137 may be a code in which a sum of all bits in the coded message CM corresponds to an even number. Therefore, the ECC encoder 140 may encode the data DTA such that a sum of message bits in the message MSG1 indicates whether the message MSG1 includes an error bit.

FIG. 4 is a diagram for describing on-chip ECC levels according to data bits and parity bits.

In FIG. 4, SEC represents single error correction, DED represents double error detection and DEC represents double error correction. FIG. 4 illustrates parity bits and corresponding size overheads of the parity bits (PARITY 0/H). The parity bits correspond to a Hamming code or an extended Hamming code. The size overhead of the parity bits correspond to a ratio of the parity bits of the parity data corresponding to the write data to the data bits of the write data.

As illustrated in FIG. 4, as the number of parity bits (referred to as the parity bit number) is increased with respect to the same number of data bits (referred to as the data bit number), that is, as the ratio of the parity bit number to the data bit number is increased, the capability of error detection and correction is increased. As the data bit number is increased with respect to the same capability of error detection and correction, the corresponding parity bit number is increased but the ratio of the parity bit number to the data bit number is decreased.

As such, the error detection capability and/or the error correction capability may be increased as the ratio of the parity bit number to the corresponding data bit number is increased. As a result, the on-chip ECC level may be raised as the ratio of the parity bit number to the corresponding data bit number is increased.

Memory resources may be wasted and a size of the semiconductor memory device may be increased if the on-chip ECC level is set higher than necessary. In contrast, the error detection and correction capability may be degraded and performance of the semiconductor memory device may be degraded if the on-chip ECC level is set lower than necessary.

Figure 5:
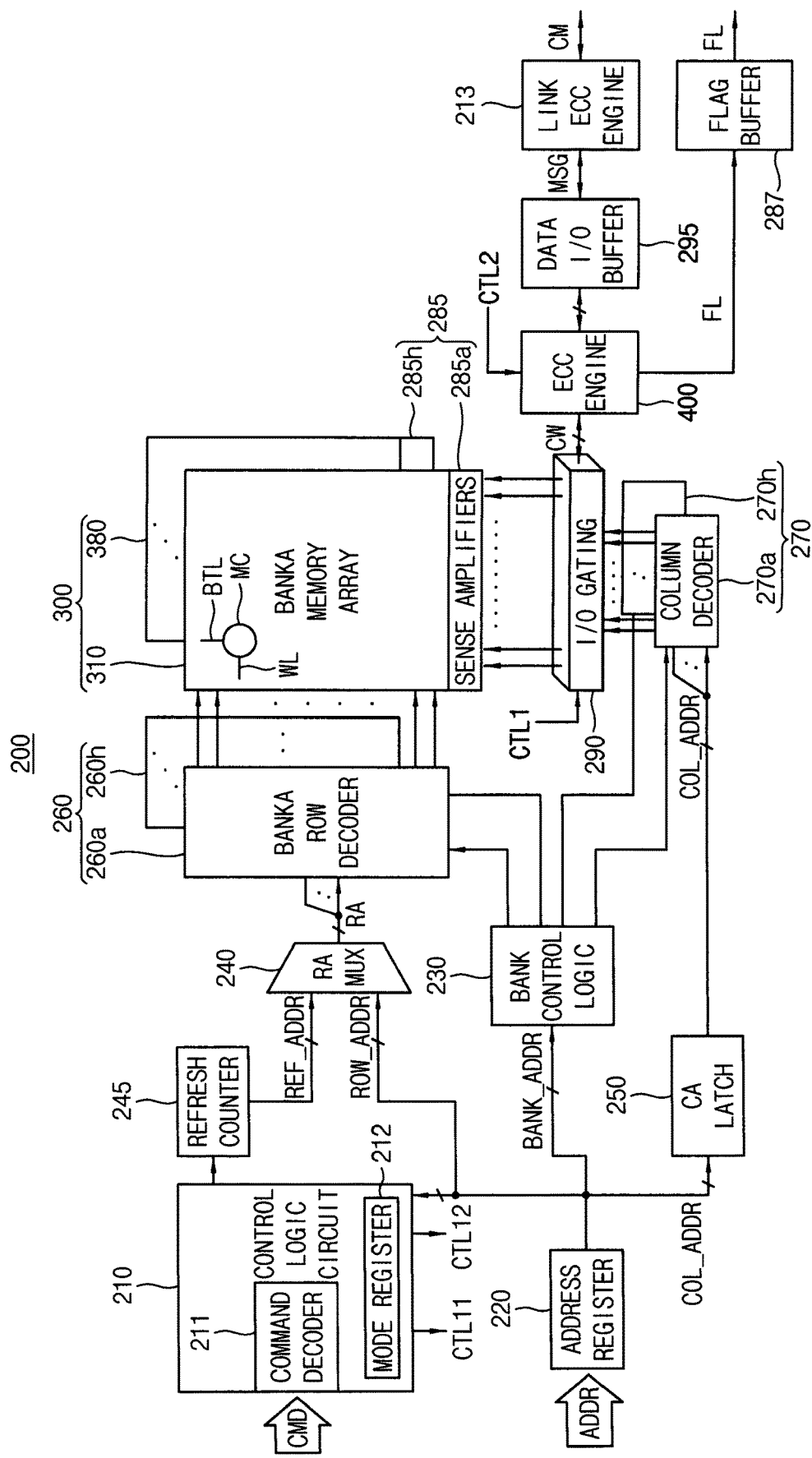
FIG. 5 is a block diagram illustrating a semiconductor memory device in the memory system of FIG. 1 according to example embodiments.

FIG. 5 is a block diagram illustrating the semiconductor memory device in the memory system of FIG. 1 according to example embodiments.

Referring to FIG. 5, the semiconductor memory device 200 includes a control logic circuit 210, an address register 220, a bank control logic 230, a row address multiplexer (RA MUX) 240, a column address (CA) latch 250, a row decoder 260, a column decoder 270, a memory cell array 300, a sense amplifier 285, an input/output (I/O) gating circuit (I/O GATING) 290, a data input/output (I/O) buffer 295, a refresh counter 245, an ECC engine 400, a link ECC engine 213 and a flag buffer 287.

The memory cell array 300 includes first through eighth bank arrays 310~380. The row decoder 260 includes first through eighth bank row decoders 260a-260h respectively coupled to the first through eighth bank arrays 310~380, the column decoder 270 includes first through eighth bank column decoders 270a-270h respectively coupled to the first through eighth bank arrays 310~380, and the sense amplifier 285 includes first through eighth bank sense amplifiers 285a-285h respectively coupled to the first through eighth bank arrays 310~380.

The first through eighth bank arrays 310~380, the first through eighth bank row decoders 260a-260h, the first through eighth bank column decoders 270a-270h and first through eighth bank sense amplifiers 285a-285h may form first through eighth banks. Each of the first through eighth bank arrays 310~380 includes a plurality of memory cells MC coupled to word-lines WL and bit-lines BTL.

The address register 220 receives an address ADDR including a bank address BANK_ADDR, a row address ROW_ADDR and a column address COL_ADDR from the memory controller 100, and the control logic circuit 210 receives a command CMD from the memory controller 100.

The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a-260h corresponding to the bank address BANK_ADDR may be activated in response to the bank control signals, and one of the first through eighth bank column decoders 270a-270h corresponding to the bank address BANK_ADDR may be activated in response to the bank control signals.

The row address multiplexer (RA MUX) 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a-260h.

The activated one of the first through eighth bank row decoders 260a-260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a-270h.

The activated one of the first through eighth bank column decoders 270a-270h may decode the column address COL_ADDR that is output from the column address latch 250, and may control the I/O gating circuit 290 in order to output data corresponding to the column address COL_ADDR.

The I/O gating circuit (I/O GATING) 290 includes a circuitry for gating input/output data. The I/O gating circuit (I/O GATING) 290 further includes read data latches for storing data that is output from the first through eighth bank arrays 310~380, and write drivers for writing data to the first through eighth bank arrays 310~380.

A Codeword CW to be read from one bank array of the first through eighth bank arrays 310~380 may be sensed by a sense amplifier coupled to the one bank array from which the data is to be read, and may be stored in the read data latches. The codeword CW stored in the read data latches of the I/O gating circuit (I/O GATING) 290 is ECC-decoded by the ECC engine 400 and may be provided to the memory controller 100 via the data I/O buffer 295.

A Message MSG to be written in one bank array of the first through eighth bank arrays 310~380 may be provided to the data I/O buffer 295 from the memory controller 100. The message MSG may be provided to the ECC engine 400. The ECC engine 400 performs an ECC encoding on the message MSG to generate parity bits and provides the I/O gating circuit (I/O GATING) 290 with codeword CW including the message MSG and the parity bits. The I/O gating circuit (I/O GATING) 290 may write the codeword CW in a target page in the one bank array through the write drivers.

The ECC engine 400 may generate characteristic information and a syndrome vector with regard to the codeword read from the target page, may generate a transmission codeword by selectively correcting an error bit in the read codeword based on the characteristic information and the syndrome vector, and may generate a flag signal FL indicating that whether the transmission codeword includes an error bit. The ECC engine 400 may use a second ECC represented by the parity check matrix when the ECC engine 400 performs the ECC encoding and/or the ECC decoding. The second ECC may be an SEC code. Therefore, the ECC engine 400 mat detect two error bits and may correct one error bit.

The flag buffer 287 receives the flag signal FL and transmits the flag signal FL to the memory controller 100.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit (I/O GATING) 290 and a second control signal CTL2 to control the ECC engine 400.

Figure 6:
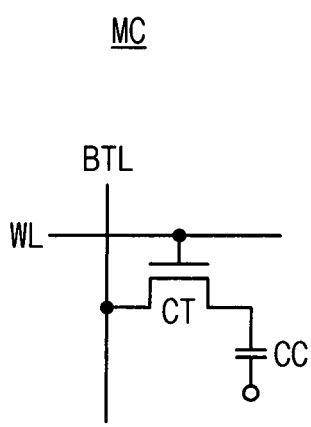
FIG. 6 is a circuit diagram of an example implementation of a memory cell of the semiconductor memory device shown in FIG. 5.

FIG. 6 is a circuit diagram of an example implementation of the memory cell shown in FIG. 5.

Referring to FIG. 6, a memory cell MC includes a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

FIG. 6 illustrates the memory cell MC is implemented with a dynamic memory cell. However, in some example embodiments, the memory cell MC may be implemented with a resistive memory cell.

Figure 7:
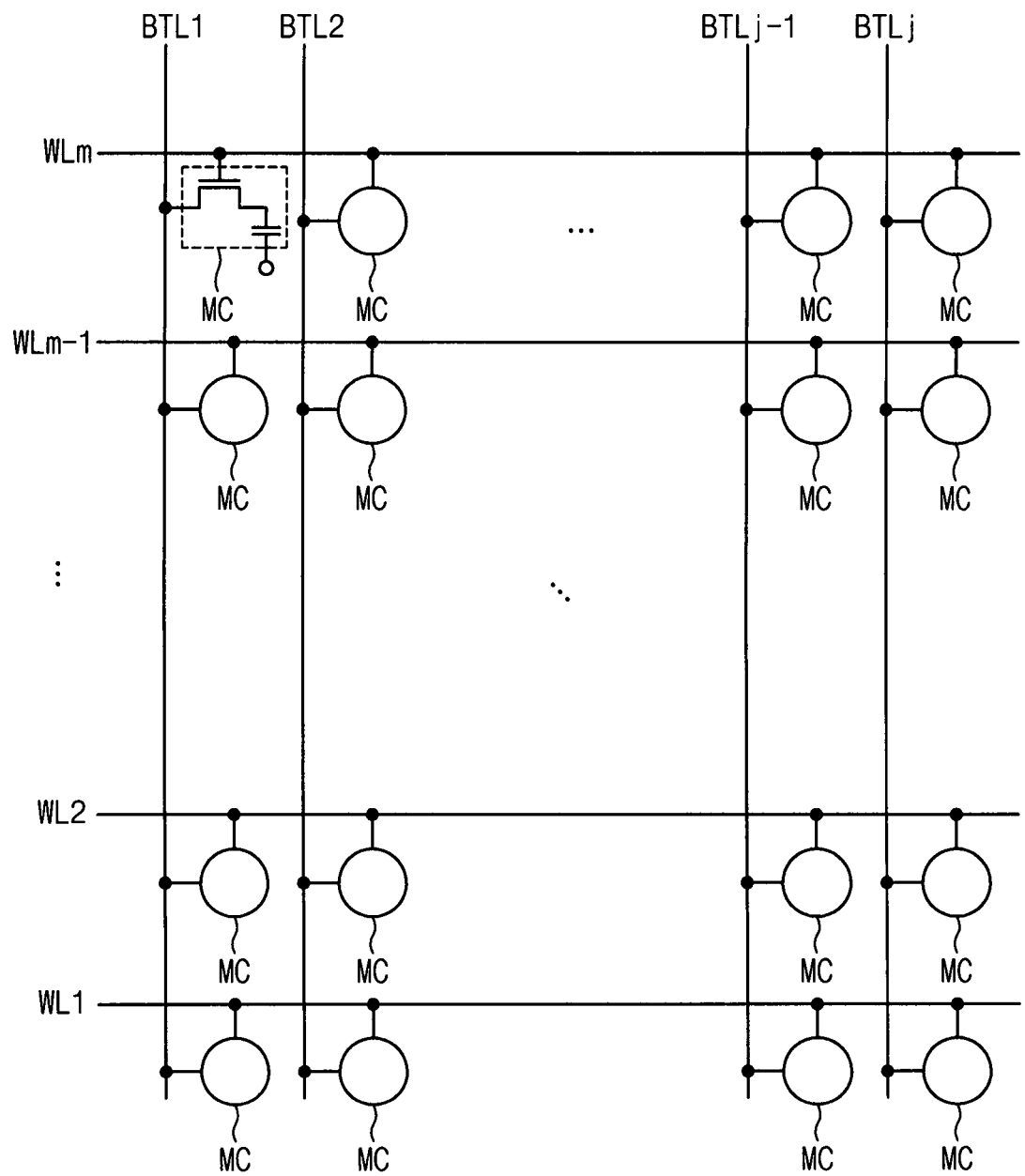
FIG. 7 illustrates an example of a first bank array in the semiconductor memory device of FIG. 5.

FIG. 7 illustrates an example of the first bank array in the semiconductor memory device of FIG. 5.

Referring to FIG. 7, the first bank array 310 a plurality of word-lines WL1~WLm (m is a natural number greater than two), a plurality of bit-lines BTL1~BTLj (j is a natural number greater than two), and a plurality of memory cells MCs disposed near intersections between the word-lines WL1~WLm and the bit-lines BTL1~BTLj. In some example embodiments, each of the plurality of memory cells MCs may include a dynamic random access memory (DRAM) cell structure. The plurality of word-lines WL1~WLm to which the plurality of memory cells MCs are connected may be defined as rows of the first bank array 310 and the plurality of bit-lines BTL1~BTLj to which the plurality of memory cells MCs are connected may be defined as columns of the first bank array 310.

Figure 8:
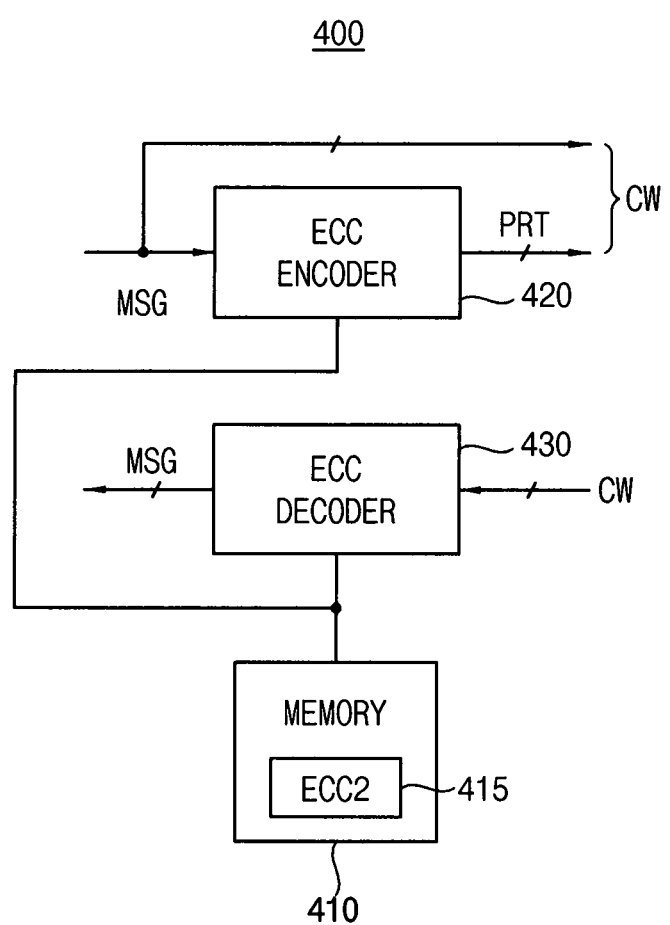
FIG. 8 is a block diagram illustrating an ECC engine in the semiconductor memory device of FIG. 5 according to example embodiments.

FIG. 8 is a block diagram illustrating the ECC engine in the semiconductor memory device of FIG. 5 according to example embodiments.

Referring to FIG. 8, the ECC engine 400 includes a memory 410, an ECC encoder 420 and an ECC decoder 430. The memory 410 stores a second ECC (ECC2) 415, the ECC encoder 420 and the ECC decoder 430 are connected to the memory 410 and the ECC encoder 420 and the ECC decoder 430 use the second ECC 415.

The ECC encoder 420 is connected to the memory 410, and performs an ECC encoding on the message MSG to generate parity bits PRT based on the second ECC 415 in a write operation. The ECC encoder 420 may provide the I/O gating circuit (I/O GATING) 290 with the codeword CW including the message MSG and the parity bits PRT.

The ECC decoder 430 is connected to the memory 410, receives the codeword CW in a read operation, generates the characteristic information representing a first error information associated with message bits in the message MSG of the codeword CW based on the message bits, generates the syndrome vector indicating a second error information associated with the codeword CW by performing an operation on the message bits and the parity bits PRT based on the second ECC 315, selectively corrects an error bit in the codeword CW based on the characteristic information and the syndrome vector, and generates the flag signal FL indicating whether a transmission message to be transmitted to the memory controller 100 includes an error bit.

The second ECC (ECC2) 415 may be a SEC code. The ECC decoder 430 may detect two error bits and correct one error bit based on the SEC code. Therefore, the ECC decoder 430 may enhance error detection capability without increasing parity overhead.

Although it is described that the ECC encoder 420 and the ECC decoder 430 are coupled to the memory 410 to use the second ECC (ECC2) 415, the second ECC (ECC2) 415 may be implemented with exclusive OR gates within the ECC encoder 420 and the ECC decoder 430.

Figure 9:
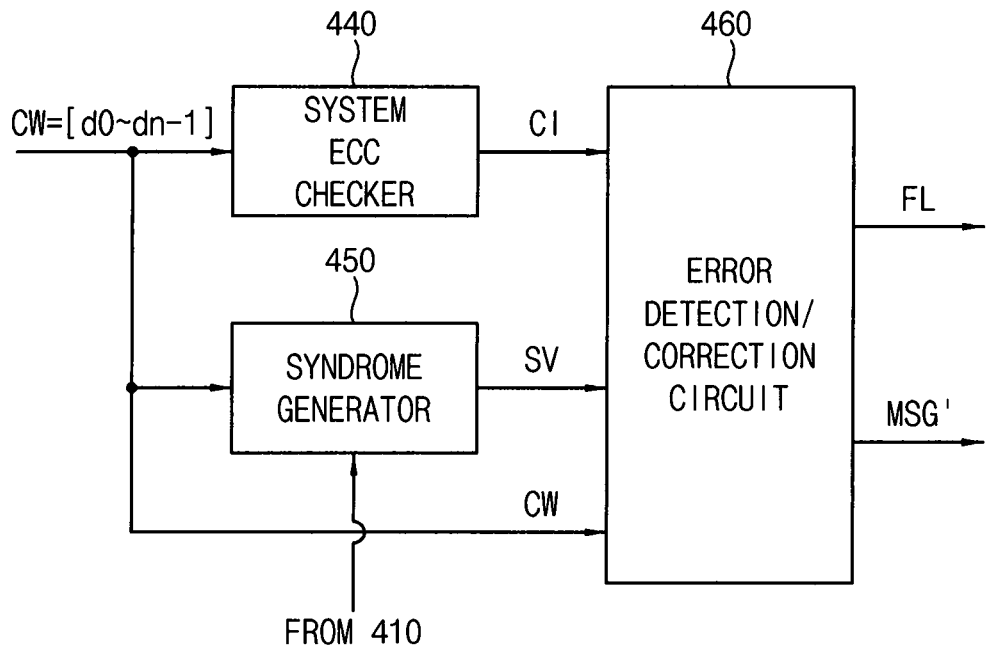
FIG. 9 is a block diagram illustrating an ECC decoder in the ECC engine of FIG. 8 according to example embodiments.

FIG. 9 is a block diagram illustrating the ECC decoder in the ECC engine of FIG. 8 according to example embodiments.

Referring to FIG. 9, the ECC decoder 430 includes a system ECC checker 440, a syndrome generator 450 and an error detection/correction circuit 460.

The ECC checker 440 may generate the characteristic information CI representing a first error information associated with the message bits based on the message bits in the codeword CW. The syndrome generator 450 may output a syndrome vector SV representing a second error information associated with the codeword CW by performing an operation on the message bits and parity bits in the codeword CW based on a parity check matrix implementing the second ECC (ECC2) 415. The error detection/correction circuit 460 may selectively correct an error bit in the codeword CW based on the characteristic information CI and the syndrome vector SV, may generate the flag signal FL indicating whether the codeword CW includes an error bit, and may output the flag signal FL and a transmission message MSG' to be transmitted to the memory controller 100 based on the codeword CW.

Figure 10:
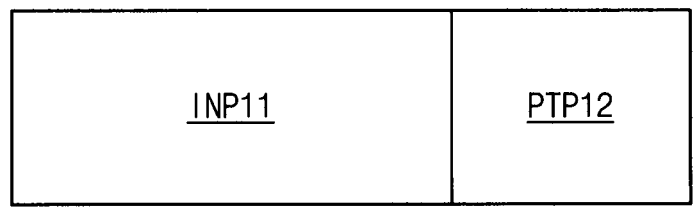
FIG. 10 illustrates a first type of parity check matrix that implements a second ECC.

FIG. 10 illustrates a first type of parity check matrix that implements the second ECC.

Referring to FIG. 10, a parity check matrix PCM1 may include a first part INP11 corresponding to the message bits and a second part PTP12 corresponding to the parity bits. The parity check matrix PCM1 is stored in the memory 410 and may implement the second ECC (ECC2) 415. The first part INP11 may include a plurality of column vectors corresponding respectively to the message bits, and each of the column vectors may include high-level elements corresponding to an even number. The second part PTP12 may include a plurality of parity column vectors corresponding to the parity bits, respectively and each of the parity column vectors may include high-level elements corresponding to an odd number. The parity check matrix PCM1 may include different column vectors and different row vectors.

Figure 11:
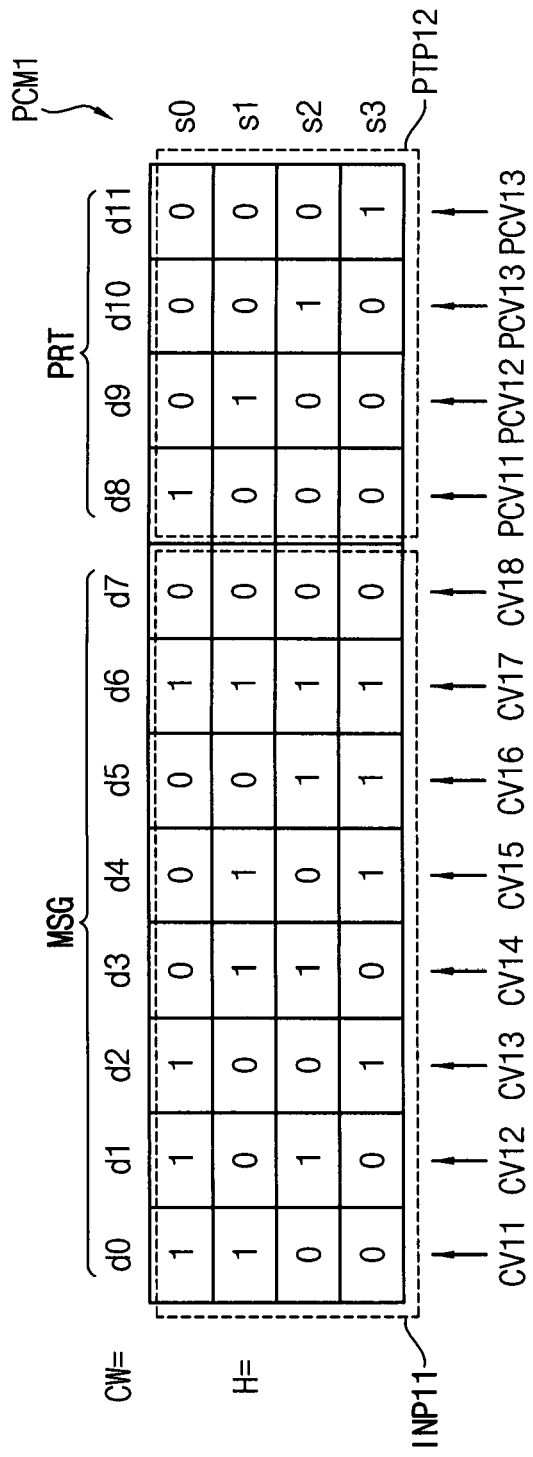
FIG. 11 illustrates in detail the first type of parity check matrix in FIG. 10.

FIG. 11 illustrates in detail the first type of parity check matrix in FIG. 10.

In FIG. 11, it is assumed that the codeword CW includes bits d0~d11, the message MSG includes bits (message bits) d0~d7 and the parity bits PRT include bits d8~d11.

The ECC checker 440 in FIG. 9 may perform a first modulo-two operation on sum of the message bits d0~d7 to output a result of the first modular-two operation, associated with the first error information, as the characteristic information CI.

Referring to FIG. 11, each of column vectors CV11~CV17 corresponding to each of the message bits d0~d7, respectively, includes high-level elements corresponding to an even number, and each of parity column vectors PCV11~PCV14 corresponding to each of the parity bits PRT including the bits d8~d11, respectively, includes high-level elements corresponding to an odd number. In addition, row vectors in a row direction are different with one another and column vectors in a column direction are different with one another.

In FIG. 11, the column vector CV18 corresponding to the message bit d7 includes all zero elements. In general, a parity check matrix does not use a column vector having all zero elements, the error detection/correction circuit 440 knows that the ECC encoder 140 in FIG. 3 employs an even code, and thus the error detection/correction circuit 440 may determine whether an error bit occurs in the message bit d7 based on the characteristic information CI.

In addition, in FIG. 11, s0~s3 denotes elements of the syndrome vector SV.

Figure 12A:
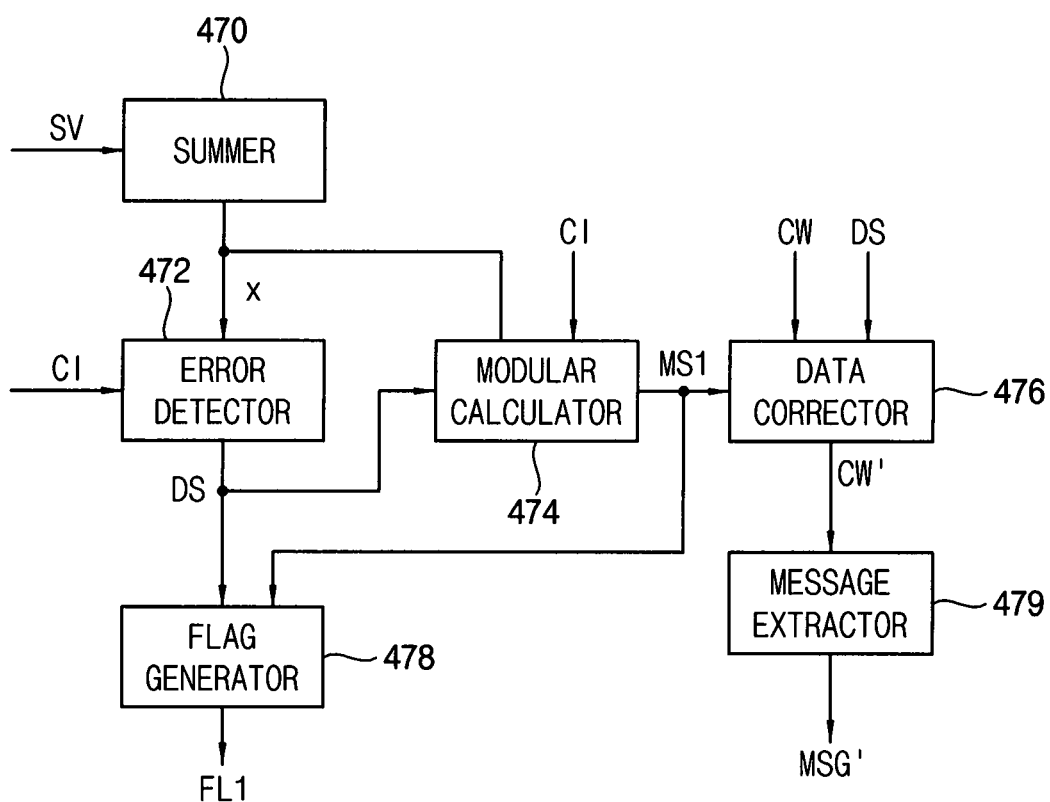
FIG. 12A is a block diagram illustrating an example of an error detection/correction circuit of the ECC decoder in FIG. 9 according to example embodiments.

FIG. 12A is a block diagram illustrating an example of the error detection/correction circuit in FIG. 9 according to example embodiments.

In FIG. 12A, it is assumed that the syndrome generator 450 in FIG. 9 employs the first type of parity check matrix PCM1 in FIG. 9.

Referring to FIG. 12A, an error detection/correction circuit 460a includes a summer 470, an error detector 472, a modulo calculator 474, a data corrector 476, a message extractor 479 and a flag generator 478.

The summer 470 receives the syndrome vector SV and generates a summed signal x by calculating a sum of elements of the syndrome vector SV. The error detector 472 receives the characteristic information CI and the summed signal x and generates a detection signal DS indicating whether the codeword CW includes an error bit based on whether the sum of the summed signal x and the characteristic information CI corresponds to zero. That is, the error detector 472 adds the summed signal x and the characteristic information CI, determines whether the result is zero, and if the result is zero, generates the detection signal DS. The modulo calculator 474 receives the characteristic information CI, the summed signal x and the detection signal DS, performs a second modulo-two operation on a sum of the summed signal x and the characteristic information CI in response to the sum of the summed signal x and the characteristic information CI being non-zero and generates a modulo signal MS1 indicating whether a result of the second modulo-two operation is zero. The data corrector 476 receives the codeword CW, the detection signal DS and the modulo signal MS1, and selectively corrects the codeword CW to provide a transmission codeword CW' based on the detection signal DS and the modulo signal MS1. The message extractor 479 extracts a transmission message MSG' from the transmission codeword CW' and outputs the transmission message MSG'.

The flag generator 478 receives the detection signal DS and the modulo signal MS1 and generates a flag signal FL1 indicating whether the transmission codeword CW' includes an error bit based on the detection signal DS and the modulo signal MS1. The flag generator 478 may output the flag signal FL1 with a first logic level in response to the detection signal DS indicating that the codeword CW includes no error bit.

The modulo calculator 474 may perform the second modulo-two operation in response to the detection signal DS indicating that the codeword CW includes the error bit, and the data corrector 476 may correct the error bit in the codeword CW to output the transmission codeword CW' in response to the modulo signal MS1 indicating that the result of the second modulo-two operation is non-zero. In this case, the flag generator 478 may output the flag signal FL1 with the first logic level in response to the detection signal DS and the modulo signal MS1 to represent that the transmission message MSG' includes no error bit.

The modulo calculator 474 may perform the second modulo-two operation in response to the detection signal indicating that the codeword CW includes the error bit, and the data corrector 476 may output the transmission codeword CW' without correcting the error bit in the codeword CW in response to the modulo signal MS1 indicating that the result of the second modulo-two operation is zero. In this case, the flag generator 478 may output the flag signal FL1 with a second logic level in response to the detection signal DS and the modulo signal MS1 to represent that the transmission message MSG' includes error bits that are uncorrectable.

FIG. 12B is a table illustrating a number of error bits, which is determined according to the characteristic information, the syndrome vector and the summed signal in the error detection/correction circuit in FIG. 12A.

Referring to FIGS. 12A and 12B, when the characteristic information CI is zero and the syndrome vector SV is a zero vector, the codeword CW includes no error bit. When the characteristic information CI is zero, and the summed signal x is an odd number, the codeword CW includes one error bit. When the characteristic information CI is zero, and the summed signal x is a positive even number, the codeword CW includes two error bits. When the characteristic information CI is a high level, and the summed signal x is an odd number, the codeword CW includes two error bits. When the characteristic information CI is a high level, and the summed signal x is a positive even number, the codeword CW includes one error bit.

When the codeword CW includes one error bit, the data corrector 476 corrects the error bit in the codeword CW to output the transmission codeword CW'. In this case, the flag signal FL1 has a first logic level (e.g., a low level). When the codeword CW includes two error bits, the data corrector 476 outputs the transmission codeword CW' without correcting the error bits in the codeword CW. In this case, the flag signal FL1 has a first logic level (e.g., a low level). In this case, the flag signal FL2 has a second logic level (e.g., a high level).

Figure 13:
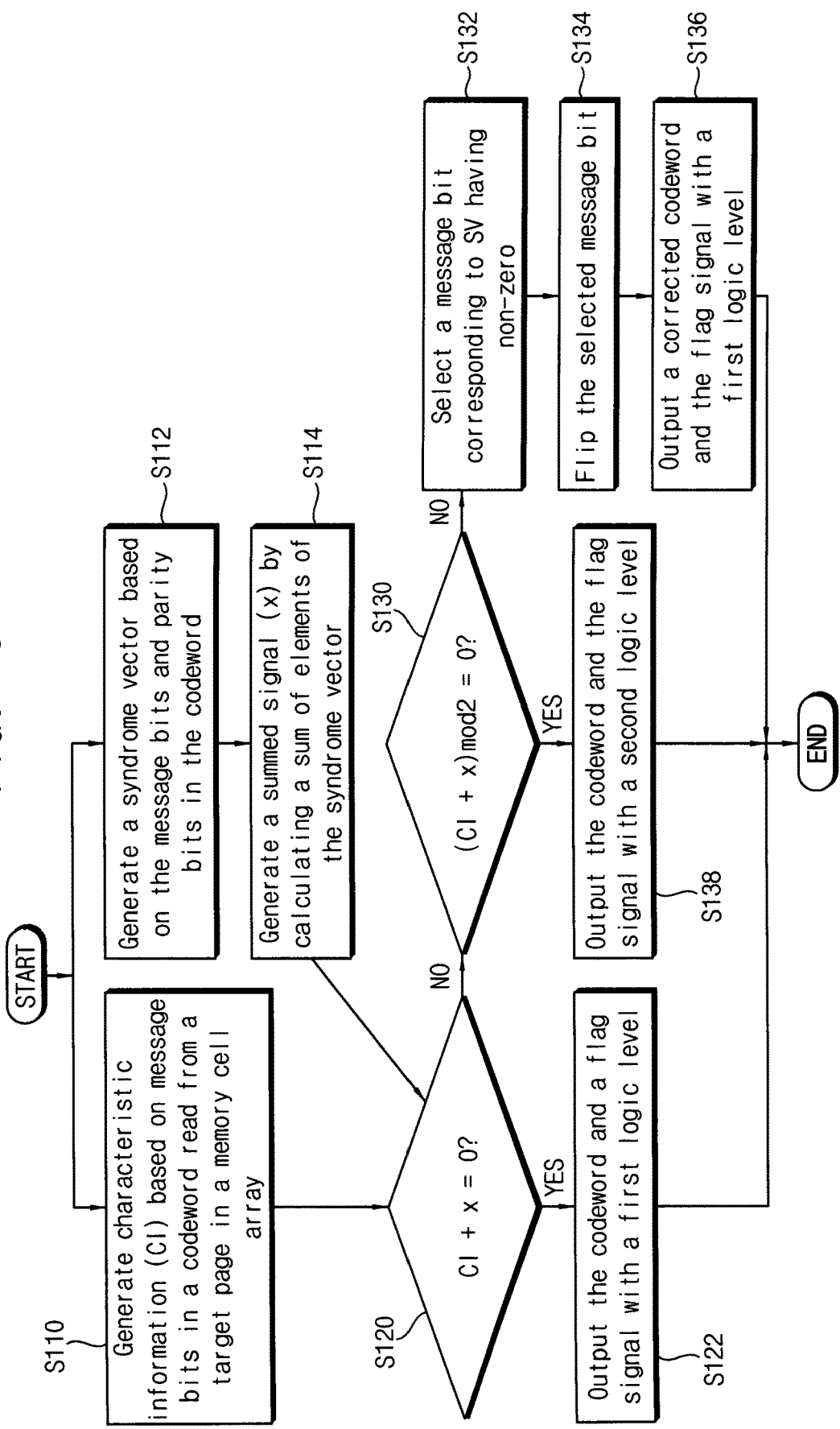
FIG. 13 is a flow chart illustrating an example operation of the ECC decoder of FIG. 9 according to example embodiments.

FIG. 13 is a flow chart illustrating an example operation of the ECC decoder of FIG. 9 according to example embodiments.

Referring to FIGS. 9 through 13, in an operation S110, the ECC checker 440 generates characteristic information CI based on message bits in a codeword CW read from a target page in a memory cell array. For example, the ECC checker 440 performs a first modulo-two operation on the sum of the message bits d0~d7 to generate the characteristic information CI. In an operation S112, the syndrome generator 450 generates a syndrome vector based on the message bits and parity bits in the codeword CW. For example, the syndrome generator 450 performs an operation on the codeword CW to generate the syndrome vector SV by using the first type of parity check matrix PCM1. In an operation S114, the summer 470 generates the summed signal x by calculating the sum of elements of the syndrome vector SV. In an operation S120, the error detector 472 determines whether the characteristic information CI added to the summed signal x is equal to zero. The error detector 472 generates the detection signal DS indicating whether the codeword CW includes an error bit based on whether the sum of the summed signal x and the characteristic information CI corresponds to zero. In an operation S122, when the sum of the summed signal x and the characteristic information CI corresponds to zero (operation S120, YES), the codeword and a flag signal with a first logic level are output. The flag generator 478 outputs the flag signal FL1 with a first logic level and the message extractor 479 outputs the transmission message MSG' based on the transmission codeword CW' since the codeword CW includes no error bit.

When the sum of the summed signal x and the characteristic information CI corresponds to non-zero (operation S120, NO), the modulo calculator 474 performs a second modulo-two operation on a sum of the summed signal x and the characteristic information CI to generate the modulo signal MS1. It is then determined whether the modulo signal MS1 is equal to zero (operation S130). When the modulo signal MS1 is zero (operation S130, YES), the codeword and a flag signal with a second logic level are output in operation S138. The flag generator 478 outputs the flag signal FL1 with a second logic level since the codeword CW includes uncorrectable error bits. The data corrector 476 outputs the transmission codeword CW' without correcting the error bits in the codeword CW and the message extractor 479 outputs the transmission message MSG' from the transmission codeword CW'.

When the modulo signal MS1 is a high level (i.e., non-zero) (operation S130, NO), which indicates that the codeword CW includes a correctable error bit, the data corrector 476 selects a message bit corresponding to a non-zero element of the syndrome vector SV in operation S132, and flips the selected message bit (operation S134), and outputs a corrected codeword and a flag signal with a first logic level (operation S136). That is, the data corrector 476 outputs the transmission codeword CW' by correcting the error bit in the codeword CW. The message extractor 479 outputs the transmission message MSG' from the transmission codeword CW' and the flag generator 478 outputs the flag signal FL1 with the first logic level.

FIG. 14 is a table illustrating a number of error bits, which is determined according to the characteristic information, the syndrome vector and the summed signal in the error detection/correction circuit in FIG. 12A.

As illustrated in FIG. 14, a number of error bits and position of the error bits may be detected based on combination of the characteristic information CI, the syndrome vector SV and the summed signal x.

Therefore, the first type of the parity check matrix PCM1 may represent t (t is a natural number greater than zero)-bit correction code, and the error detection/correction circuit 460a may correct t error bit in the codeword CW and may detect (t+1) error bits in the codeword CW. For example, when the t is one, the first type of the parity check matrix PCM1 represents SEC code, and the error detection/correction circuit 460a corrects one error bit in the codeword CW and detects two error bits in the codeword CW. Therefore, the error detection/correction circuit 460a may perform SEC-DED.

Figure 15:
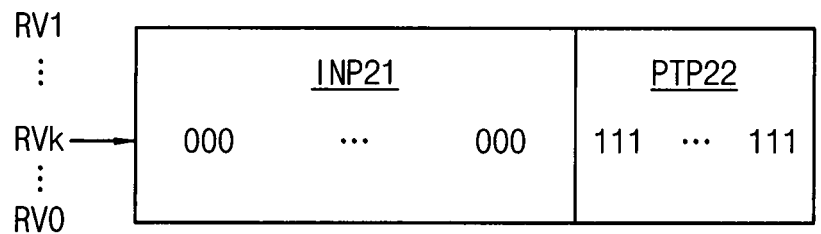
FIG. 15 illustrates a second type of parity check matrix that implements a second ECC.

FIG. 15 illustrates a second type of parity check matrix that implements the second ECC.

Referring to FIG. 15, a parity check matrix PCM2 may include a first part INP21 corresponding to the message bits and a second part PTP22 corresponding to the parity bits. The parity check matrix PCM2 is stored in the memory 410 and may implement the second ECC (ECC2) 415. The parity check matrix PCM2 includes a plurality of row vectors RV1~RVo, and a row vector RVk of the row vectors RV1~RVo has a first sub part corresponding to the first part INP21 and a second sub party corresponding to the second part PTP22. All elements in the first sub part have a low level and all elements in the second sub part have a high level. The parity check matrix PCM2 may include different column vectors and different row vectors.

Figure 16:
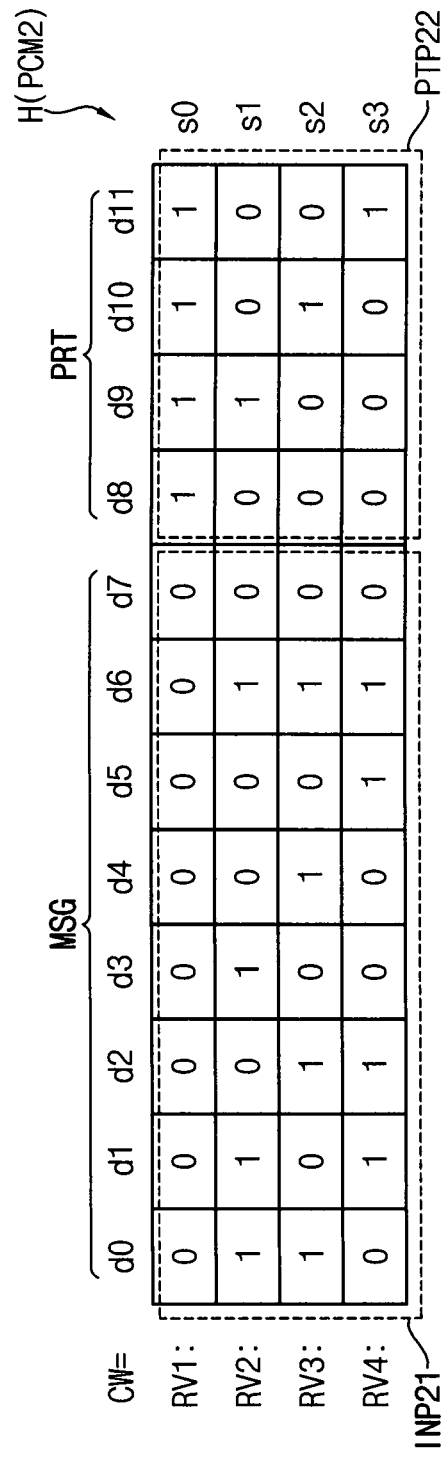
FIG. 16 illustrates in detail the second type of parity check matrix in FIG. 15.

FIG. 16 illustrates in detail the second type of parity check matrix in FIG. 15.

In FIG. 16, it is assumed that the codeword CW includes bits d0~d11, the message MSG includes bits (message bits) d0~d7 and the parity bits PRT include bits d8~d11.

The ECC checker 440 in FIG. 9 may perform a first modulo-two operation on sum of the message bits d0~d7 to output a result of the first modular-two operation, associated with the first error information, as the characteristic information CI.

Referring to FIG. 16, the second type of parity check matrix PCM2 includes row vectors RV1~RV4 and the row vector RV1 (a first row vector) has a first sub part including all zero elements and a second sub part including all non-zero elements. The first sub part corresponds to the first part INP21 and the second sub part corresponds to the second part PTP22. In addition, elements s0~s3 of the syndrome vector SV may be generated based on the row vectors RV1~RV4.

In FIG. 16, a column vector corresponding to the message bit d7 includes all zero elements. In general, a parity check matrix does not use a column vector having all zero elements, the error detection/correction circuit 440 knows that the ECC encoder 140 in FIG. 3 employs an even code, and the error detection/correction circuit 440 may determine whether an error bit occurs in the message bit d7 based on the characteristic information CI.

Figure 17A:
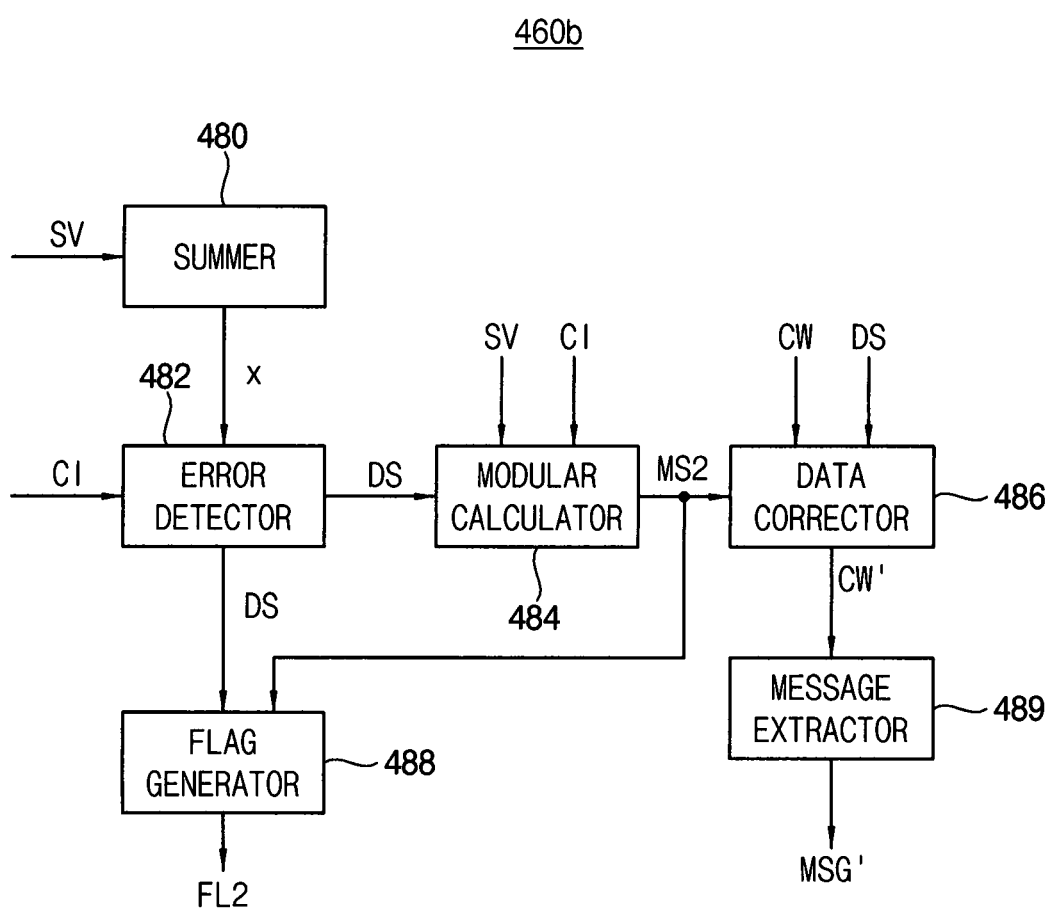
FIG. 17A is a block diagram illustrating another example of the error detection/correction circuit in FIG. 9 according to example embodiments.

FIG. 17A is a block diagram illustrating another example of the error detection/correction circuit in FIG. 9 according to example embodiments.

In FIG. 17A, it is assumed that the syndrome generator 450 in FIG. 9 employs the second type of parity check matrix PCM2 in FIG. 15.

Referring to FIG. 17A, an error detection/correction circuit 460b includes a summer 480, an error detector 482, a modulo calculator 484, a data corrector 486, a message extractor 489 and a flag generator 488.

The summer 480 receives the syndrome vector SV and generates a summed signal x by calculating a sum of elements of the syndrome vector SV. The error detector 482 receives the characteristic information CI and the summed signal x and generates a detection signal DS indicating whether the codeword CW includes an error bit based on whether the sum of the summed signal x and the characteristic information CI corresponds to zero. That is, the error detector 482 adds the summed signal x and the characteristic information CI, determines whether the result is zero, and if the result is zero, generates the detection signal DS. The modulo calculator 484 receives the characteristic information CI, the syndrome vector SV and the detection signal DS, performs a second modulo-two operation on a sum of a selected element of the syndrome vector SV, which corresponds to the row vector RVk, and the characteristic information CI in response to the sum of the summed signal x and the characteristic information CI being non-zero and generates a modulo signal MS2 indicating whether a result of the second modulo-two operation is zero. The data corrector 486 receives the codeword CW, the detection signal DS and the modulo signal MS2, and selectively corrects the codeword CW to provide a transmission codeword CW' based on the detection signal DS the modulo signal MS2. The message extractor 489 extracts a transmission message MSG' from the transmission codeword CW' and outputs the transmission message MSG'.

The flag generator 488 receives the detection signal DS and the modulo signal MS2 and generates a flag signal FL2 indicating whether the transmission codeword CW' includes an error bit based on the detection signal DS and the modulo signal MS2.

The modulo calculator 484 may perform the second modulo-two operation in response to the detection signal DS indicating that the codeword CW includes the error bit, and the data corrector 486 may correct the error bit in the codeword CW to output the transmission codeword CW' in response to the modulo signal MS2 indicating that the result of the second modulo-two operation is non-zero. In this case, the flag generator 488 may output the flag signal FL2 with the first logic level in response to the detection signal DS and the modulo signal MS2 to represent that the transmission message MSG' includes no error bit.

The modulo calculator 484 may perform the second modulo-two operation in response to the detection signal indicating that the codeword CW includes the error bit, and the data corrector 486 may output the transmission codeword CW' without correcting the error bit in the codeword CW in response to the modulo signal MS2 indicating that the result of the second modulo-two operation is zero. In this case, the flag generator 488 may output the flag signal FL2 with a second logic level in response to the detection signal DS and the modulo signal MS2 to represent that the transmission message MSG' includes error bits that are uncorrectable.

FIG. 17B is a table illustrating a number of error bits, which is determined according to the characteristic information, the syndrome vector and the summed signal in the error detection/correction circuit in FIG. 17A.

Referring to FIGS. 17A and 17B, when the characteristic information CI is zero and the syndrome vector SV is a zero vector, the codeword CW includes no error bit. When the characteristic information CI is zero, and the selected element s(k−1) is high level, the codeword CW includes one error bit. When the characteristic information CI is zero, the selected element s(k−1) is high level and the syndrome vector SV is not a zero vector, the codeword CW includes two error bits. When the characteristic information CI is a high level, and the selected element s(k−1) is high level, the codeword CW includes two error bits. When the characteristic information CI is high level, the selected element s(k−1) is low level and the syndrome vector SV is not a zero vector, the codeword CW includes one error bit.

FIG. 18 is a flow chart illustrating another example operation of the ECC decoder of FIG. 9 according to example embodiments.

Referring to FIGS. 9 and 14 through 18, in an operation S210, the ECC checker 440 generates characteristic information CI based on message bits in a codeword read from a target page in a memory cell array. For example, the ECC checker 440 performs a first modulo-two operation on the sum of the message bits d0~d7 to generate the characteristic information CI. In an operation S212, the syndrome generator 450 generates a syndrome vector based on the message bits and parity bits in the codeword. For example, the syndrome generator 450 performs an operation on the codeword CW to generate the syndrome vector SV by using the second type of parity check matrix PCM2. In an operation S214, the summer 480 generates the summed signal x by calculating the sum of elements of the syndrome vector SV. In an operation S220, the error detector 482 determines whether the sum of the characteristic information CI and the summed signal x is zero. The error detector 482 generates the detection signal DS indicating whether the codeword CW includes an error bit based on whether the sum of the summed signal x and the characteristic information CI corresponds to zero. When the sum of the summed signal x and the characteristic information CI corresponds to zero (operation S220, YES), the codeword and a flag signal with a first logic level are output in operation S222. The flag generator 488 outputs the flag signal FL2 with a first logic level and the message extractor 489 outputs the transmission message MSG' based on the transmission codeword CW' since the codeword CW includes no error bit.

When the sum of the summed signal x and the characteristic information CI corresponds to non-zero (operation S220, NO), the modulo calculator 484 performs a second modulo-two operation on a sum of the selected element s(k−1) and the characteristic information CI to generate the modulo signal MS2. The modulo calculator 484 determines whether the modulo signal MS2 is equal to zero (operation S230). When the modulo signal MS1 is zero (operation S230, YES), the codeword and a flag signal with a second logic level are output. The flag generator 488 outputs the flag signal FL2 with a second logic level since the codeword CW includes uncorrectable error bits. The data corrector 486 outputs the transmission codeword CW' without correcting the error bits in the codeword CW and the message extractor 489 outputs the transmission message MSG' from the transmission codeword CW'.

When the modulo signal MS2 is a high level (operation S230, NO), which indicates that the codeword CW includes a correctable error bit, the data corrector 486 selects a message bit corresponding to a non-zero element of the syndrome vector SV in operation S232, and flips the selected message bit in operation S234, and outputs a corrected codeword and a flag signal with a first logic level in operation S236. The data collector 486 outputs the transmission codeword CW' by correcting the error bit in the codeword CW. The message extractor 489 outputs the transmission message MSG' from the transmission codeword CW' and the flag generator 488 outputs the flag signal FL2 with the first logic level.

FIG. 19 is a table illustrating a number of error bits, which is determined according to the characteristic information, the syndrome vector and the selected element in the error detection/correction circuit in FIG. 17A.

As illustrated in FIG. 19, a number of error bits and position of the error bits may be detected based on characteristic information CI, the selected element s(k−1) and combination of the characteristic information CI and the selected element s(k−1).

Therefore, the second type of the parity check matrix PCM2 may represent t-bit correction code, and the error detection/correction circuit 460b may correct t error bit in the codeword CW and may detect (t+1) error bits in the codeword CW. For example, when the t is one, the second type of the parity check matrix PCM2 represents SEC code and the error detection/correction circuit 460b corrects one error bit in the codeword CW and detects two error bits in the codeword CW. Therefore, the error detection/correction circuit 460a may perform SEC-DED.

Figure 20:
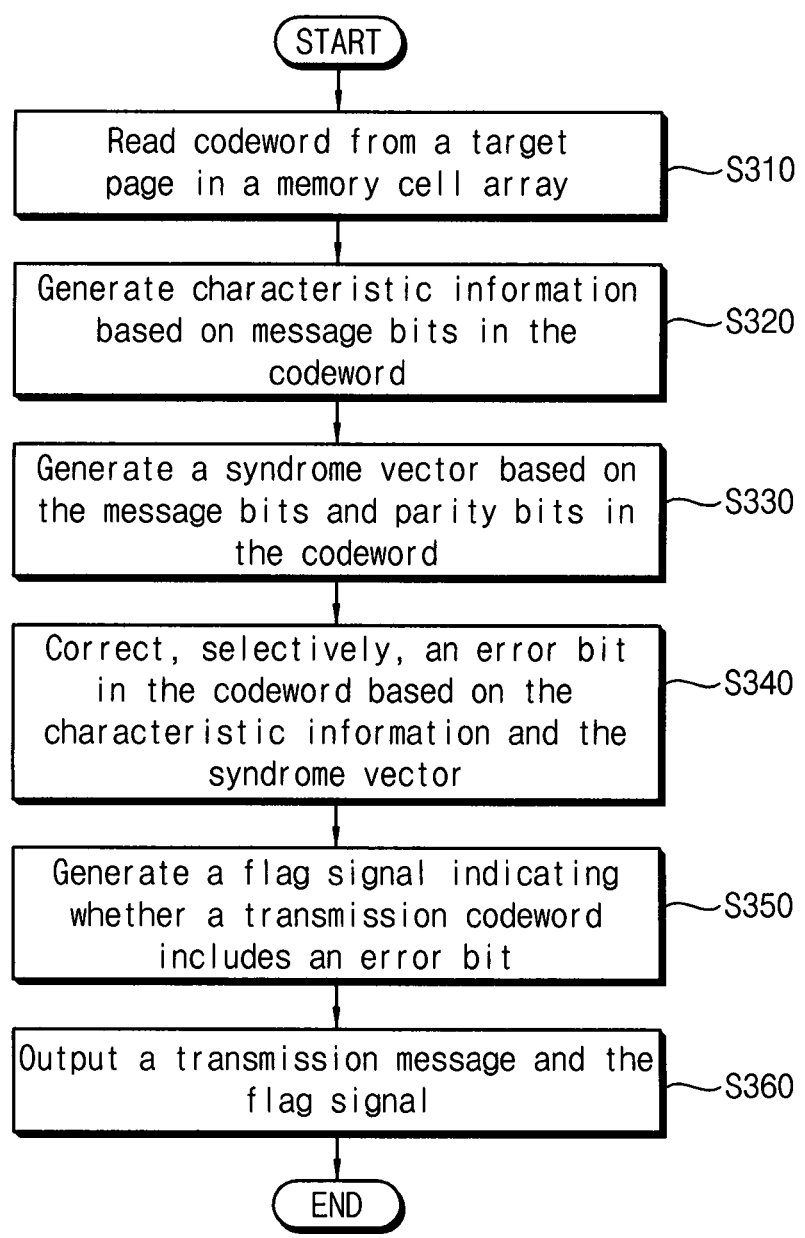
FIG. 20 is a flow chart illustrating a method of operating a semiconductor memory device according to example embodiments.

FIG. 20 is a flow chart illustrating a method of operating a semiconductor memory device according to example embodiments.

Referring to FIGS. 5 through 20, in a method of operating a semiconductor memory device 200, a codeword CW is read from a target page of the memory cell array 300 (operation S310). The ECC checker 440 generates the characteristic information CI based on message bits in the codeword CW (operation S320). The syndrome generator 450 generates the syndrome vector SV based on the message bits and parity bits in the codeword CW (operation S330). The error detection/correction circuit 460 selectively corrects an error bit in the codeword CW based on the characteristic information CI and the syndrome vector SV (operation S340) to output a transmission codeword CW'. The flag generator 478 generate the flag signal FL indicating whether the transmission codeword CW' includes an error bit (operation S350). A transmission message and the flag signal are output (operation S360). The message extractor 479 extracts a transmission message MSG' from the transmission codeword CW' and transmits the transmission message MSG' and the flag signal FL to the memory controller 100.

Figure 21:
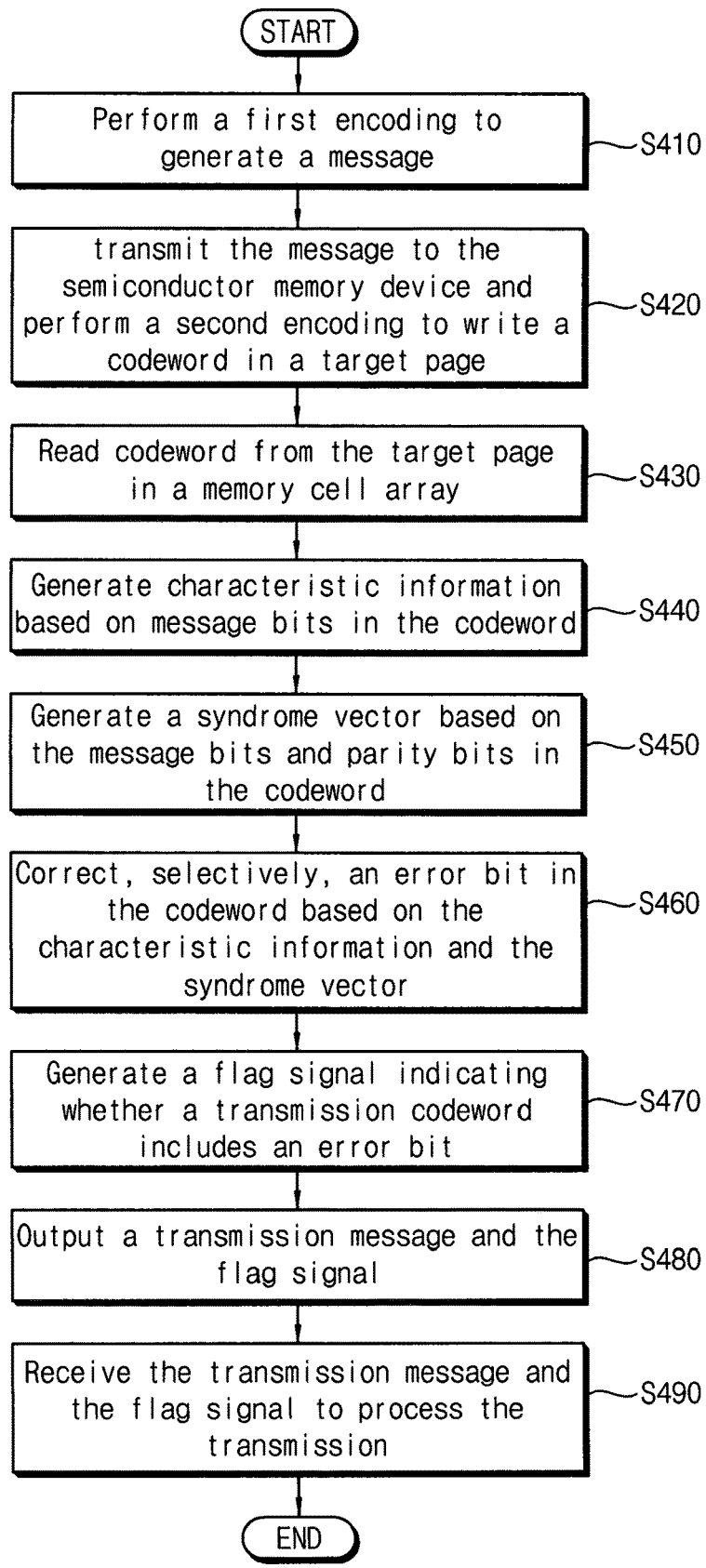
FIG. 21 is a flow chart illustrating a method of operating a memory system according to example embodiments.

FIG. 21 is a flow chart illustrating a method of operating a memory system according to example embodiments.

Referring to FIGS. 1 through 21, in a method of operation a memory system 10, the memory controller 100 performs a first encoding to generate a message (operation S410). For example, the memory controller 100 performs the first encoding on the data DTA to generate a message MSG The memory controller 100 transmits the message MSG to the semiconductor memory device 200 and performs a second encoding on the message MSG to generate codeword CW and writes the codeword CW in a target page of the memory cell array 300 (operation S420). The codeword CW is read from a target page of the memory cell array 300 (operation S430). The ECC checker 440 generates the characteristic information CI based on message bits in the codeword CW (operation S440). The syndrome generator 450 generates the syndrome vector SV based on the message bits and parity bits in the codeword CW (operation S450). The error detection/correction circuit 460 selectively corrects an error bit in the codeword CW based on the characteristic information CI and the syndrome vector SV (operation S460) to output a transmission codeword CW'. The flag generator 478 generates the flag signal FL indicating whether the transmission codeword CW' includes an error bit (operation S470). A transmission message and the flag signal are output (operation S480). The message extractor 479 extracts a transmission message MSG' from the transmission codeword CW' and transmits the transmission message MSG' and the flag signal FL to the memory controller 100. The memory controller 100 receives the transmission message and the flag signal and processes the transmission (operation S490). For example, the memory controller processes the error bit in the transmission message MSG' based on the flag signal FL.

Figure 22:
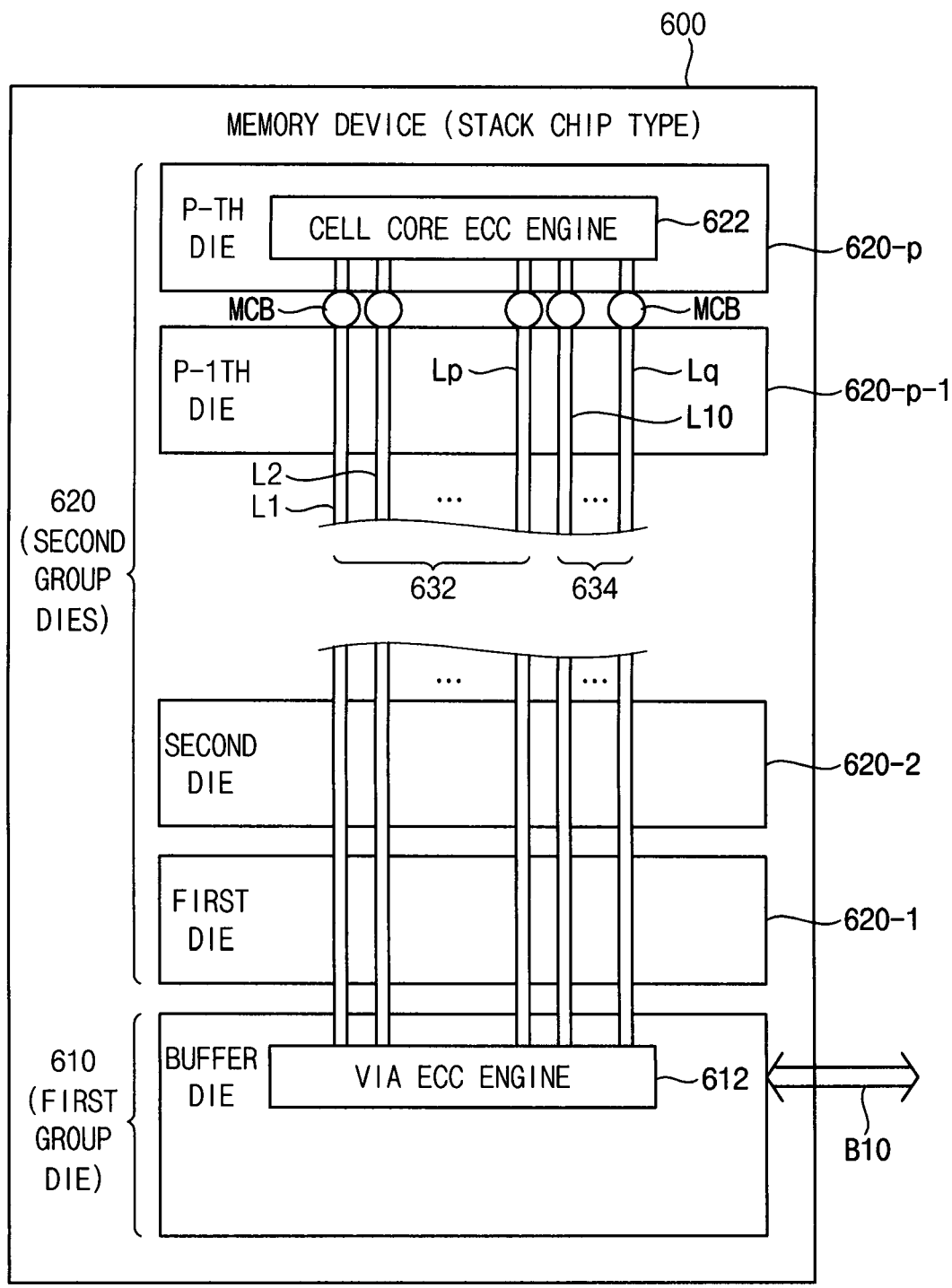
FIG. 22 is a block diagram illustrating a semiconductor memory device according to example embodiments.

FIG. 22 is a block diagram illustrating a semiconductor memory device according to example embodiments.

Referring to FIG. 22, a semiconductor memory device 600 may include a first group die 610 and second group dies 620 providing a soft error analyzing and correcting function in a stacked chip structure.

The first group die 610 may include at least one buffer die. The second group dies 620 may include a plurality of memory dies 620-1 to 620-p which is stacked on the first group die 610 and conveys data through a plurality of through silicon via (TSV) lines.

At least one of the memory dies 620-1 to 620-p may include a first type ECC engine 622 which generates transmission parity bits (i.e., transmission parity data) based on transmission data to be sent to the first group die 610. The first type ECC engine 622 may be referred to as 'cell core ECC engine'. The first type ECC engine 622 may employ the ECC engine 400 of FIG. 8. Therefore, the first type ECC engine 622 may correct one error bit and may detect two error bits by using SEC code in ECC decoding.

The buffer die 610 may include a second type ECC engine 612 which corrects a transmission error using the transmission parity bits when a transmission error is detected from the transmission data received through the TSV lines and generates error-corrected data. The second type ECC engine 612 may be referred to as 'via ECC engine'.

With the above description, a data TSV line group 632 which is formed at one memory die 620-p may include 128 TSV lines L1 to Lp, and a parity TSV line group 634 may include 8 TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with a memory controller through the data bus B10.

When an error is detected from read data in a high bandwidth memory (HBM) or the stacked memory structure, the error is an error occurring due to noise while data is transmitted through the TSV.

According to example embodiments, as illustrated in FIG. 22, the cell core ECC engine 622 may be included in the memory die, the via ECC engine 612 may be included in the buffer die. Accordingly, it may be possible to detect and correct soft data fail. The soft data fail may include a transmission error which is generated due to noise when data is transmitted through TSV lines.

Figure 23:
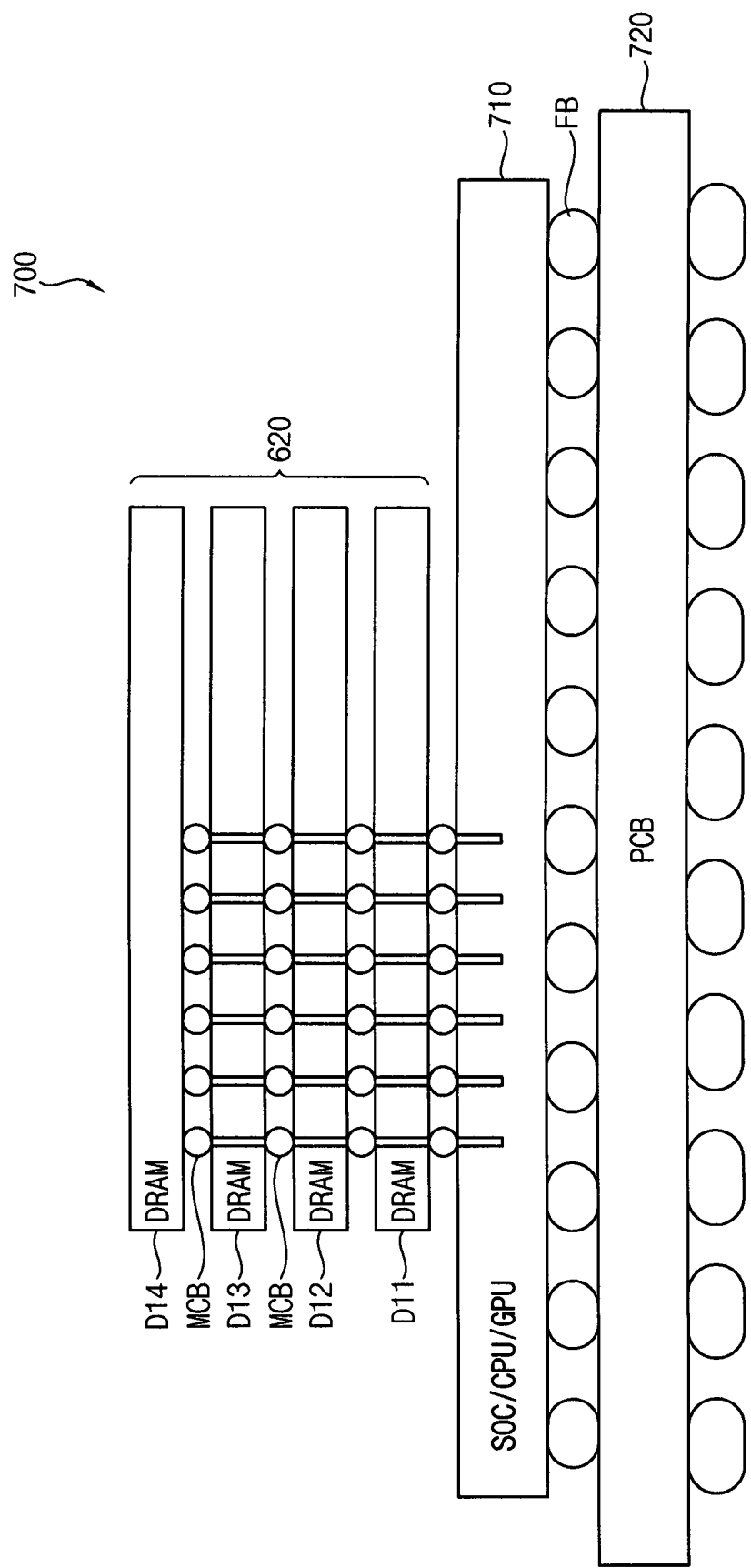
FIG. 23 is a cross-sectional view of a three dimensional (3D) chip structure employing the semiconductor memory device of FIG. 22 according to example embodiments.

FIG. 23 is a cross-sectional view of a 3D chip structure employing the semiconductor memory device of FIG. 22 according to example embodiments.

FIG. 23 shows a 3D chip structure 700 in which a host and a HBM are directly connected without an interposer layer.

Referring to FIG. 23, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement a HBM structure such as the memory dies 620 in FIG. 22. In FIG. 23, the buffer die 610 or a logic die of FIG. 22 is omitted. However, the buffer die 610 or the logic die may be disposed between the memory die D11 and the host die 710. To implement the HBM structure such as the memory dies 620, TSV lines may be formed at the memory dies D11 and D14. The TSV lines may be electrically connected with micro bumps MCB placed between memory dies.

Figure 24:
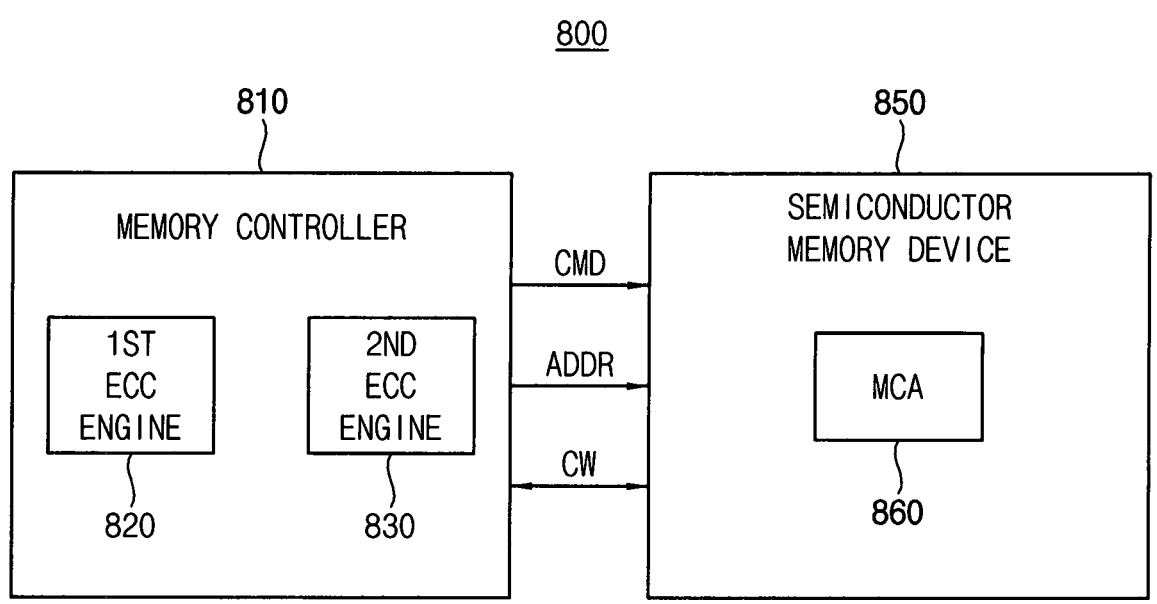
FIG. 24 is a block diagram illustrating a memory system according to example embodiments.

FIG. 24 is a block diagram illustrating a memory system according to example embodiments.

Referring to FIG. 24, a memory system 800 may include a memory controller 810 and a semiconductor memory device 850.

The memory controller 810 includes a first ECC engine 820 and a second ECC engine 830. The first ECC engine 820 may use a code such as single parity check code or SEC-DED code, in which a sum of all bits in a coded message corresponds to an even number. The second ECC engine 830 may use an SEC code.

The memory controller 810 performs a concatenated ECC encoding on data to generate a codeword CW by using the first ECC engine 820 and the second ECC engine 830 and transmits the codeword CW to the semiconductor memory device 850. In addition, the a first ECC engine 820 and the second ECC engine 830 perform a concatenated ECC decoding on the codeword CW received from the semiconductor memory device 850 and correct an error bit in the codeword CW to recover data. The second ECC engine 830 may employ the ECC decoder 430 in FIG. 9.

In addition, the memory controller 810 transmits a command CMD and an address ADDR to the semiconductor memory device 850.

The semiconductor memory device 850 includes a memory cell array (MCA) 860 and the codeword CW may be stored in the memory cell array 860. The memory cell array 860 may include dynamic memory cells or nonvolatile memory cells.

The present disclosure may be applied to semiconductor memory devices and memory systems employing the ECC.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. An error correction code (ECC) decoder of a semiconductor memory device, the ECC decoder comprising:
an ECC checker configured to generate characteristic information representing first error information associated with message bits in an input codeword that is read from a target page in a memory cell array;

a syndrome generator configured to output a syndrome vector representing second error information associated with the input codeword by performing an operation on the message bits and parity bits in the input codeword based on a parity check matrix; and an error detection/correction circuit configured to generate a transmission codeword by selectively correcting an error bit in the input codeword based on the characteristic information and the syndrome vector, generate a flag signal indicating whether the transmission codeword includes an error bit, and output a transmission message based on the transmission codeword.

2. The ECC decoder of claim 1, wherein the parity check matrix includes:
   a first part corresponding to the message bits; and
   a second part corresponding to the parity bits,
   wherein the first part includes a plurality of column vectors, each including an even number of high-level elements,
   wherein the second part includes a plurality of parity column vectors, each including an odd number of high-level elements,
   wherein the parity check matrix corresponds to a first type of parity check matrix that includes a plurality of different row vectors and a plurality of different column vectors, and
   wherein the ECC checker is configured to perform a first modulo-two operation on a first sum of the message bits to output a first result of the first modulo-two operation, associated with the first error information, as the characteristic information.

3. The ECC decoder of claim 2, wherein the error detection/correction circuit is configured to:
   generate a summed signal by calculating a second sum of elements of the syndrome vector;
   perform selectively a second modulo-two operation on a third sum of the summed signal and the characteristic information, based on whether the third sum corresponds to zero;
   correct selectively the input codeword based on the summed signal and a second result of the second modulo-two operation; and
   generate the flag signal.

4. The ECC decoder of claim 2, wherein the error detection/correction circuit includes:
   a summer configured to generate a summed signal by calculating a second sum of elements of the syndrome vector;
   an error detector configured to generate a detection signal indicating whether the input codeword includes an error bit based on whether a third sum of the summed signal and the characteristic information corresponds to zero;
   a modulo calculator configured to perform a second modulo-two operation on the third sum in response to the third sum being non-zero to generate a modulo signal indicating whether a second result of the second modulo-two operation is zero;
   a data corrector configured to selectively correct the input codeword to generate the transmission codeword, based on the summed signal and the modulo signal;
   a message extractor configured to extract a transmission message from the transmission codeword and to output the transmission message; and a flag generator configured to generate the flag signal indicating whether the transmission codeword includes an error bit based on the detection signal and the modulo signal.

5. The ECC decoder of claim 4, wherein the flag generator is configured to output the flag signal with a first logic level in response to the detection signal indicating that the transmission codeword includes no error bit.

6. The ECC decoder of claim 4, wherein:
   the modulo calculator is configured to perform the second modulo-two operation in response to the detection signal indicating that the transmission codeword includes the error bit;
   the data corrector is configured to correct the error bit in the input codeword to generate the transmission codeword in response to the modulo signal indicating that the second result of the second modulo-two operation is non-zero; and
   the flag generator is configured to output the flag signal with a first logic level in response to the detection signal and the modulo signal to represent that the transmission message includes no error bit.

7. The ECC decoder of claim 4, wherein:
   the modulo calculator is configured to perform the second modulo-two operation in response to the detection signal indicating that the transmission codeword includes the error bit;
   the data corrector is configured to output the transmission codeword without correcting the error bit in the transmission codeword in response to the modulo signal indicating that the second result of the second modulo-two operation is zero; and
   the flag generator is configured to output the flag signal with a second logic level in response to the detection signal and the modulo signal to represent that the transmission message includes an error bit.

8. The ECC decoder of claim 1, wherein the parity check matrix includes:
   a first part corresponding to the message bits; and
   a second part corresponding to the parity bits,
   wherein a first row vector of a plurality of row vectors of the parity check matrix includes a first sub part corresponding to the first part and a second sub part corresponding to the second part, all elements in the first sub part have a low level, and all elements in the second sub part have a high level,
   the parity check matrix corresponds to a second type of parity check matrix that includes the plurality of different row vectors and a plurality of different column vectors, and
   wherein the ECC checker is configured to perform a first modulo-two operation on a first sum of the message bits to output a first result of the first modular-two operation, associated with the first error information, as the characteristic information.

9. The ECC decoder of claim 8, wherein the error detection/correction circuit is configured to:
   generate a summed signal by calculating a second sum of elements of the syndrome vector;
   perform selectively a second modulo-two operation on a third sum of the characteristic information and a selected element in the syndrome vector based on whether a fourth sum of the summed signal and the characteristic information corresponds to zero, the selected element corresponding to the first row vector;

correct selectively the input codeword based on the summed signal and a second result of the second modulo-two operation; and generate the flag signal.

10. The ECC decoder of claim 8, wherein the error detection/correction circuit includes:

a summer configured to generate a summed signal by calculating a second sum of elements of the syndrome vector;

an error detector configured to generate a detection signal indicating whether the input codeword includes an error bit, based on whether a third sum of the summed signal and the characteristic information corresponds to zero;

a modulo calculator configured to perform a second modulo-two operation on a fourth sum of the characteristic information and the selected element in response to the third sum being non-zero to generate a modulo signal indicating whether a second result of the second modulo-two operation is zero;

a data corrector configured to selectively correct the input codeword to generate the transmission codeword, based on the detection signal and the modulo signal;

a message extractor configured to extract a transmission message from the transmission codeword and to output the transmission message; and a flag generator configured to generate the flag signal indicating whether the transmission codeword includes an error bit based on the detection signal and the modulo signal.

11. The ECC decoder of claim 10, wherein the flag generator is configured to output the flag signal with a first logic level in response to the detection signal indicating that the transmission codeword includes no error bit.

12. The ECC decoder of claim 10, wherein:

the modulo calculator is configured to perform the second modulo-two operation in response to the detection signal indicating that the transmission codeword includes the error bits;

the data corrector is configured to correct the error bit in the input codeword to generate the transmission codeword in response to the modulo signal indicating that the second result of the second modulo-two operation is non-zero; and the flag generator is configured to output the flag signal with a first logic level in response to the detection signal and the modulo signal to represent that the transmission message includes no error bit.

13. The ECC decoder of claim 10, wherein:

the modulo calculator is configured to perform the second modulo-two operation in response to the detection signal indicating that the transmission codeword includes the error bits;

the data corrector is configured to output the transmission codeword without correcting the error bit in the transmission codeword in response to the modulo signal indicating that the second result of the second modulo-two operation is zero; and the flag generator is configured to output the flag signal with a second logic level in response to the detection signal and the modulo signal to represent that the transmission message includes an error bit.

14. The ECC decoder of claim 1, wherein:

the parity check matrix represents a t-bit correction code, where t is a natural number greater than zero; and the error detection/correction circuit is configured to correct a t-bit error in the input codeword and to detect (t+1)-bit errors in the input codeword.

15. A semiconductor memory device comprising:

a memory cell array including a plurality of memory cells coupled to a plurality of word-lines and a plurality of bit-lines;

an error correction code (ECC) engine configured to perform an ECC encoding on a message received from outside of the semiconductor memory device to generate an initial codeword, store the initial codeword in a target page in the memory cell array, generate characteristic information and a syndrome vector based on the initial codeword read from the target page, generate a transmission codeword by selectively correcting an error bit in the initial codeword based on the characteristic information and the syndrome vector, and generate a flag signal indicating whether the transmission codeword includes an error bit; and a control logic circuit configured to control the ECC engine based on a command and an address received from outside the semiconductor memory device.

16. The semiconductor memory device of claim 15, wherein the ECC engine includes:

an ECC encoder configured to perform the ECC encoding on the message; and an ECC decoder including;

an ECC checker configured to generate the characteristic information representing a first error information associated with message bits based on the message bits in the initial codeword that is read;

a syndrome generator configured to output the syndrome vector representing a second error information associated with the initial codeword that is read by performing an operation on the message bits and parity bits in the initial codeword based on a parity check matrix; and an error detection/correction circuit configured to generate the transmission codeword by selectively correcting the error bit in the initial codeword that is read based on the characteristic information and the syndrome vector, and configured to generate the flag signal.

17. The semiconductor memory device of claim 15, wherein each of the plurality of memory cells includes a dynamic memory cell;

the parity check matrix represents a t-bit correction code, where t is a natural number greater than zero; and the error detection/correction circuit is configured to correct a t-bit error in the initial codeword and configured to detect (t+1)-bit errors in the initial codeword.

18. The semiconductor memory device of claim 15, further comprising:

at least one buffer die; and a plurality of memory dies, the plurality of memory dies stacked on the at least one buffer die and conveying data through a plurality of through silicon via (TSV) lines, wherein at least one of the plurality of memory dies includes the memory cell array and the ECC engine, and the ECC engine generates transmission parity bits using transmission data to be sent to the at least one buffer die, and wherein the at least one buffer die includes a via ECC engine configured to correct a transmission error using the transmission parity bits in response to the transmission error being detected from the transmission data received through the plurality of TSV lines.

19. An error correction code (ECC) decoder comprising at least one microprocessor configured to:
generate characteristic information from message bits in an input codeword read from a target page in a memory cell array;
generate a syndrome vector from the input codeword by performing an operation on the message bits and parity bits in the input codeword based on a parity check matrix; and
generate a transmission codeword by selectively correcting a first error bit in the input codeword based on the characteristic information and the syndrome vector,
wherein the ECC decoder detects whether the first error bit occurs in the input codeword and detects whether a second error bit occurs in the input codeword, based on characteristic information and the syndrome vector, and generates a flag signal indicating whether the second error bit occurs.

20. The ECC decoder of claim 19, wherein the parity check matrix includes a plurality of message vectors each corresponding to one of the message bits, and a plurality of parity vectors each corresponding to one of the parity bits, and
each message vector includes high-level elements corresponding to an even number, and each parity vector includes high-level elements corresponding to an odd number.

* * * * *